United States Patent [19]
Ware et al.

[11] Patent Number: 6,035,369
[45] Date of Patent: *Mar. 7, 2000

[54] METHOD AND APPARATUS FOR PROVIDING A MEMORY WITH WRITE ENABLE INFORMATION

[75] Inventors: Frederick Abbott Ware, Los Altos Hills; Craig Edward Hampel, San Jose; Donald Charles Stark, Woodside; Matthew Murdy Griffin, Mountain View, all of Calif.

[73] Assignee: Rambus Inc., Mountain View, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/545,294

[22] Filed: Oct. 19, 1995

[51] Int. Cl.$^7$ .................................................. G06F 12/02
[52] U.S. Cl. ...................................... 711/105; 365/189.02
[58] Field of Search ..................................... 395/431, 432; 365/189.02, 189.03, 189.05, 230.02; 711/104, 105, 145, 156, 168, 170, 173

[56] References Cited

U.S. PATENT DOCUMENTS

| | | |
|---|---|---|
| 5,195,056 | 3/1993 | Pinkham et al. . |
| 5,307,320 | 4/1994 | Farrer et al. ........................ 365/230.01 |
| 5,319,755 | 6/1994 | Farmwald et al. ....................... 395/284 |
| 5,452,429 | 9/1995 | Fuoco et al. ......................... 395/182.04 |
| 5,524,098 | 6/1996 | Holland et al. .......................... 365/219 |
| 5,581,302 | 12/1996 | Ran et al. ................................. 348/16 |
| 5,590,078 | 12/1996 | Chatter ............................... 365/189.01 |

FOREIGN PATENT DOCUMENTS

| | | |
|---|---|---|
| 0276871 | 8/1988 | European Pat. Off. . |
| 9429871 | 12/1994 | WIPO . |

OTHER PUBLICATIONS

Kalter, Howard K., et al., "A 50–ns 16–Mb DRAM with a 10–ns Data Rate and On–Chip ECC"; IEEE Journal of Solid–State Circuits, vol. 25, No. 5, Oct., 1990; pp. 1118–1127.

Architectural Overview, Rambus Inc. Publication No. DL0001–02, 1993, pp. 1–24.

Rambus Technology Guide, Preliminary, Revision 0.90, May 4, 1992, pp. 1–140.

*Primary Examiner*—Hiep T Nguyen
*Attorney, Agent, or Firm*—Blakely, Sokoloff, Taylor & Zafman LLP

[57] ABSTRACT

A method is described for providing a memory with a serial sequence of write enable signals that are offset in time with respect to respective data received by a plurality of data inputs of the memory. A memory is also described with an array for data storage, a plurality of data input pins, and a separate pin for receiving either additional data or a serial sequence of write enable signals applicable to data received by the plurality of data input pins. The additional data that the separate pin can receive includes, for example, error detection and correction (EDC) information. A method is also described for multiplexing write enable information and error detection and correction information.

52 Claims, 21 Drawing Sheets

| W/R | RAS | CAS | FUNCTION |
|---|---|---|---|
| 0 | 0 | 0 | CAS READ |
| 0 | 0 | 1 | CAS WRITE 1 |
| 0 | 1 | 0 | CAS WRITE 2 |
| 0 | 1 | 1 | CAS READ AUTO PRECHARGE |
| 1 | 0 | 0 | CAS WRITE 1 AUTO PRECHARGE |
| 1 | 0 | 1 | CAS WRITE 2 AUTO PRECHARGE |
| 1 | 1 | 0 | PRECHARGE |
| 1 | 1 | 1 | RAS |

METHOD AND APPARATUS FOR PROVIDING A MEMORY WITH WRITE ENABLE INFORMATION

FIELD OF THE INVENTION

The present invention relates to the field of electronic memories for data storage. More particularly, the present invention relates to ways of providing a memory with write enable information.

BACKGROUND OF THE INVENTION

Digital information can be stored in various types of memories, including random access memories ("RAMs"), electrically erasable read-only memories ("EEPROMs"), flash memories, etc. Data is typically stored in a two-dimensional array in which one row of bits is accessed at a time.

A RAM is a volatile memory that can be erased and written to relatively quickly, but which loses its data when power is removed. A RAM can be either static (i.e., an "SRAM") or dynamic (i.e., a "DRAM"). In an SRAM, once data is written to a memory cell, the data remains stored as long as power is applied to the chip, unless the same memory cell is written again. In a DRAM, the data stored in a memory cell must be periodically refreshed by reading the data and then writing it back again, or else the data in the cell disappears.

FIG. 1 shows a block diagram of a prior DRAM 10. DRAM 10 typically is part of a computer system that includes a high speed bus 19 and a DRAM controller. DRAM 10 includes DRAM array 11, which consists of one or more banks. For example, array 11 has Bank0 and Bank1. Interface 18 contains logic for processing and routing signals entering and leaving DRAM array 11. Signals enter and leave DRAM 10 on interface pins 6 which connect to bus 19. The number of pins making up interface pins 6 depends upon the width of bus 19 and also upon the bus protocol used by a computer system to which the DRAM is connected.

FIG. 2 shows how interface 18 communicates with Bank0 of array 11 of DRAM 10. Bank0 of array 11 can store "t" units of data. A unit of data can be a byte, and the byte is defined as being "s" bits wide, where in this case "s" is 8 bits or 9 bits (i.e., a X8 byte or a X9 byte). Address interface 60 provides column and row address signals 42 and 44. Data interfaces 51 through 53 transfer data to and from array bank 11 into and out of DRAM 10. Data to be read out of Bank0 of array 11 is carried on R lines 38, and data to be written to Bank0 of array 11 is carried on W lines 36. For example, data interface 51 provides for conveyance of data bits [t-1:0][0], these bits being the 0th bits of each of bytes 0 through t-1 of Bank0 of array 11, or all the 0th bits of the bytes to be transferred. Similarly, data interface 52 carries all the 1th bits of Bank0 of array 11.

Write enable ("WE") interface 56 provides a WE signal for each byte of data of Bank0 of array 11. Signals WE[t-1:0] are WE signals for byte 0 through byte t-1. The WE signals are carried on WE lines 34. A WE signal indicates whether an associated byte is to be written or not written during a write operation.

Control interface 58 provides the following signals: column access strobe ("CAS") 62, row access strobe ("RAS") 64, and Read/Write ("W/R") signal 66. RAS and CAS are timing signals indicating a row or column access. W/R 66 specifies whether an operation is a write operation or a read operation.

FIG. 3 shows the types of inputs to prior DRAMs. Various types of prior DRAMs have provided various separate pins for the following inputs: row address 74, column address 76, read and write data 78, a write/read input signal 82, the RAS 84, the CAS 86, and write enable signals 80. Having separate pins for each of these inputs to the DRAM is relatively inefficient because the pins take up space and not all of the signals overlap in time.

For DRAMs using different signals that are not active at the same point in time, several prior methods have been used to permit the sharing of pins, however. The sharing of pins minimizes the pin count without adversely affecting functionality.

One prior method for conserving DRAM interface pins is column/row address multiplexing. FIG. 4 illustrates column and row address multiplexing. FIG. 4 shows that one column and row address pin Arc[Nrc-1:0] 92 handles column and row address inputs 76 and 74 of FIG. 3. This is possible because column and row address signals are not active at the same time.

Another prior method is data in/out multiplexing. Data to be read and written is multiplexed onto the same pins of a DRAM. This is also referred to as Write/Read multiplexing or W/R multiplexing. FIG. 5 illustrates W/R multiplexing, in which data read from or written to a DRAM uses the same pins 102 for communicating with the exterior of the DRAM. Data is not read from and written to a DRAM at the same time, and thus it is possible to share data pins.

FIG. 6 illustrates another prior method of bit multiplexing, called data byte multiplexing. For data byte multiplexing, "t" data bits are transferred in serial over the same pin. For one prior art scheme, "t" equals 8. Each data bit is from a different byte. This is possible in prior DRAMs in which the internal RAM cycle rate, sometimes referred to as Column Access Strobe ("CAS") cycle rate, is slower than the DRAM input/output ("I/O") cycle rate.

For the example shown in FIG. 6, the I/O cycle rate is "t" times faster than the CAS cycle rate. Thus, if a block of data is "t" bytes, and one bit of each byte is to be transferred in a CAS cycle, then only one pin per "t" bits is needed during one CAS cycle for data transfer. For these reasons pins 202 can replace pins 102 of FIG. 5, and the number of data pins is reduced by a factor of "t."

In FIG. 7, another prior bit multiplexing method is shown. This method is used in typical prior DRAM systems in which row address signals and data signals are not transferred at the same time. Pins 302 transmit read and write data, but also carry row address signals 44, thus eliminating the need for pins 74 of FIG. 3. The column address requires dedicated column address pins 76 because column address information can be transferred at the same time data is transferred.

For the above described prior methods, dedicated WE pins are required. In prior memories in which WE signals travel a longer path to DRAM array 11 then do data signals, dedicated registers are required to hold data during the wait for WE signals. The WE signals indicate whether the data is to be written or not written to DRAM array 11.

FIG. 8A shows a prior art memory configuration using RDRAMs™ ("Rambus DRAMs") of Rambus, Inc. of Mountain View, Calif. FIG. 8B shows how WE information is multiplexed for that Rambus memory configuration. As shown in FIG. 8B, eight eight-bit wide WE words comprising WE block 981 are transmitted into a RDRAM over the nine-bit wide data bus and enter the RDRAM through pins BusData[7] through BusData[0] of data pins 980. The ninth data pin, pin BusData[8], is not used for transmission of the WE words. The WE words are stored in registers of the RDRAM. Each WE word is associated with a respective one of eight data blocks. Each data block is eight bytes long. Each data byte is also referred to as a data word. Each bit of each of the WE words is associated with a respective one of the eight data bytes in the respective block, which are each eight bits wide and are sent over the data bus and to the data pins of the RDRAM. Each bit of the WE word determines whether or not the associated data byte is written to the RDRAM. For example, the first WE word in WE block 981 pertains to DataBlock 0. Bit 0 of the first WE word determines whether data byte 1000 is written. Bit 1 of the first WE word determines whether data byte 1001 is written, and so on. Similarly, each WE word pertains to a data block until the final WE word of WE block 981 determines whether data bytes in DataBlock 7 are written. For this prior art scheme, a single clock cycle has two phases, allowing two transfer operations to occur within a single clock cycle.

One disadvantage of this prior method is that 64 registers are needed to hold the 64 WE bits during the time the write operation is taking place. Another disadvantage of the prior method is that a WE block must be transmitted for every group of eight data blocks that are transmitted. The periodic transmission of WE blocks takes time and therefore reduces bandwidth otherwise available for data transmission.

Prior DRAM memory systems have included some method of detecting errors in stored data. For one of these methods a type of data bit called an Error Detection and Correction ("EDC") bit is used. An EDC bit can be either a parity bit or an error correction code ("ECC") bit. Parity is a basic prior method of error detection without error correction. A parity bit is associated with a byte of data and indicates whether or not one of the bits in the byte is erroneous. One prior art scheme uses a ninth bit out of a X9 byte as the parity bit. Parity is said to be either odd or even (indicated by an exclusive-OR or exclusive-NOR operation). If a parity check reveals that the state of the parity bit is inconsistent with the state of the other bits of the data byte, a parity error is detected. When a parity error is detected, the system is typically restarted.

An ECC scheme is a more sophisticated prior EDC method. Single ECC bits do not refer to a single byte of data, as is typically the case with a parity bit. Rather, multiple ECC bits are combined to form a word that encodes complex error detection and correction information. ECC words of various widths are required to encode information for blocks of data of various sizes (a block having "t" units of data, each unit being "s" bits wide). According to a prior ECC technique a word of width $LOG_2$ (N bits/block)+2 is required to encode ECC data for a block of size N bits. With the use of ECC it is possible to both detect and correct bit errors.

The choice of which EDC scheme is used can affect DRAM performance in prior DRAM systems. When an ECC scheme is chosen, write time may be increased and performance reduced. This is true because ECC bits do not refer to a single data byte, but form part of an ECC word referring to the entire block. Thus, when it is desired to write only a portion of the block, the ECC word for the entire block will change in complex ways such that it no longer reflects accurate information about the block. This makes it necessary for every partial write to the block to involve reading out the entire block, modifying it in part so that the ECC can be reformulated, and writing the block back again. This process is called a Read/Modify/Write, or R/M/W. R/M/Ws cost extra time and are preferably avoided. If ECC is used and the entire block is written, however, the R/M/Ws are not required.

If parity is chosen, it is possible to benefit from using a Write Enable ("WE") signal associated with a single X9 byte to indicate whether the byte is to be written or not written. For certain prior DRAMs, separate WE pins convey WE signals associated with each X9 byte of the block of data. Because parity bits refer only to the X9 byte they are part of, the parity bits will be changed appropriately when a X9 byte is written, and unwritten parity bits will be unaffected. Thus, with the use of parity and WE, it is not necessary to perform R/M/Ws when writing to the memory.

SUMMARY AND OBJECTS OF THE INVENTION

One object of the present invention is to provide a memory with write enable information, yet minimizing the circuit area required and maximizing performance.

Another object of the present invention is to reduce the number of memory pins required without adversely affecting memory functionality.

Another object is to reduce memory register resources required, thereby reducing memory die size.

Another object is to allow for faster memory operation.

Another object is to allow the use of write enable and error correction and detection in a memory without the requirement of a pin dedicated solely to the write enable function.

A method is described for providing a memory with a serial sequence of write enable signals that are offset in time with respect to respective data received by a plurality of data inputs of the memory.

A memory is also described with an array for data storage, a plurality of data input pins, and a separate pin for receiving either additional data or a serial sequence of write enable signals applicable to data received by the plurality of data input pins. The additional data that the separate pin receives could, for example, be error detection and correction (EDC) information. A method is also described for multiplexing write enable information and error detection and correction information.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings in which like references indicate similar elements and in which.

DETAILED DESCRIPTION

Configurations are described below that provide a memory with write enable information. The circuit area required is minimized and performance maximized. Embodiments for a DRAM will be described. Alternative embodiments can be implemented with other memory devices, such as SRAM or flash memory. Certain embodiments allow write enable signals to be supplied to the memory in ways that reduce the number of registers required. Certain embodiments allow Write Enable ("WE") signals, data signals, and Error Detection and Correction ("EDC") signals to share the same pins, which allows one or more dedicated WE pins to be eliminated. The various embodiments will be described in more detail below.

Figure 9:
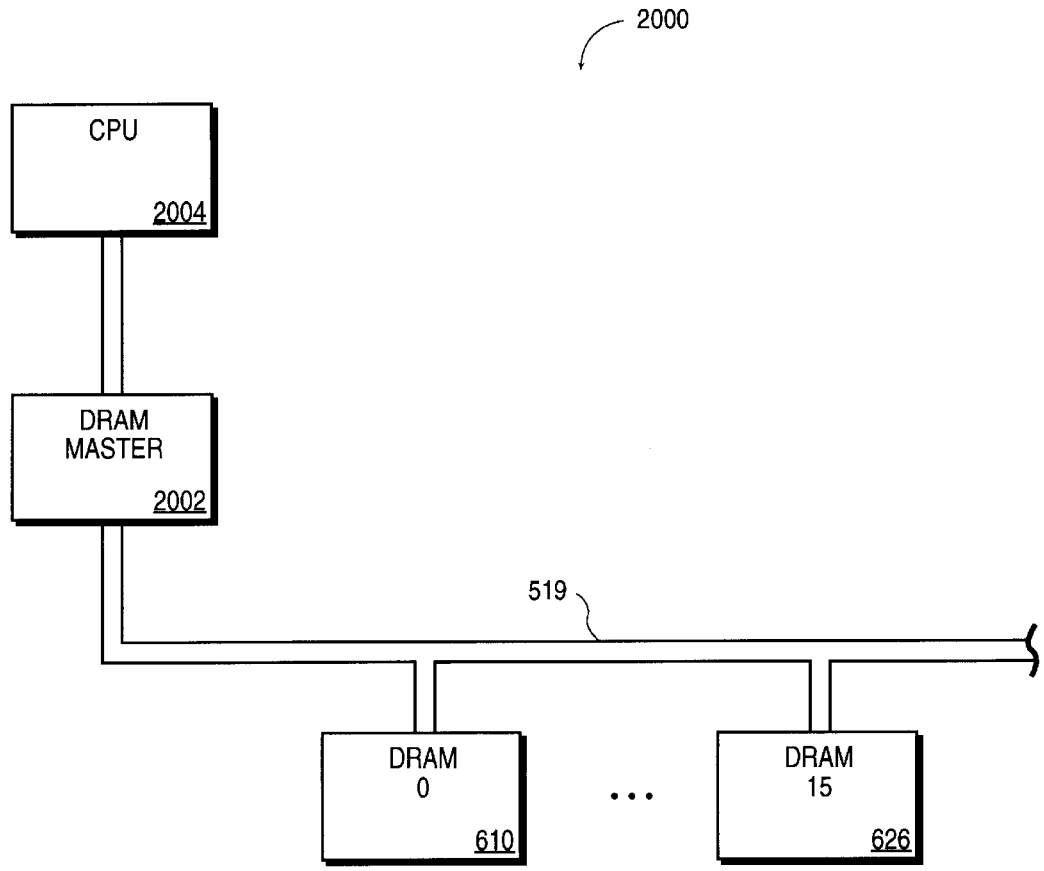
FIG. 9 shows a computer system that uses DRAMs.

FIG. 9 shows computer system 2000 that includes CPU 2004, DRAM master or controller 2002, and sixteen DRAMs 610 through 626. CPU 2004 issues commands to DRAM master 2002. DRAM master 2002 communicates with DRAMs 610 through 626 over high-speed bus 519.

Figure 10:
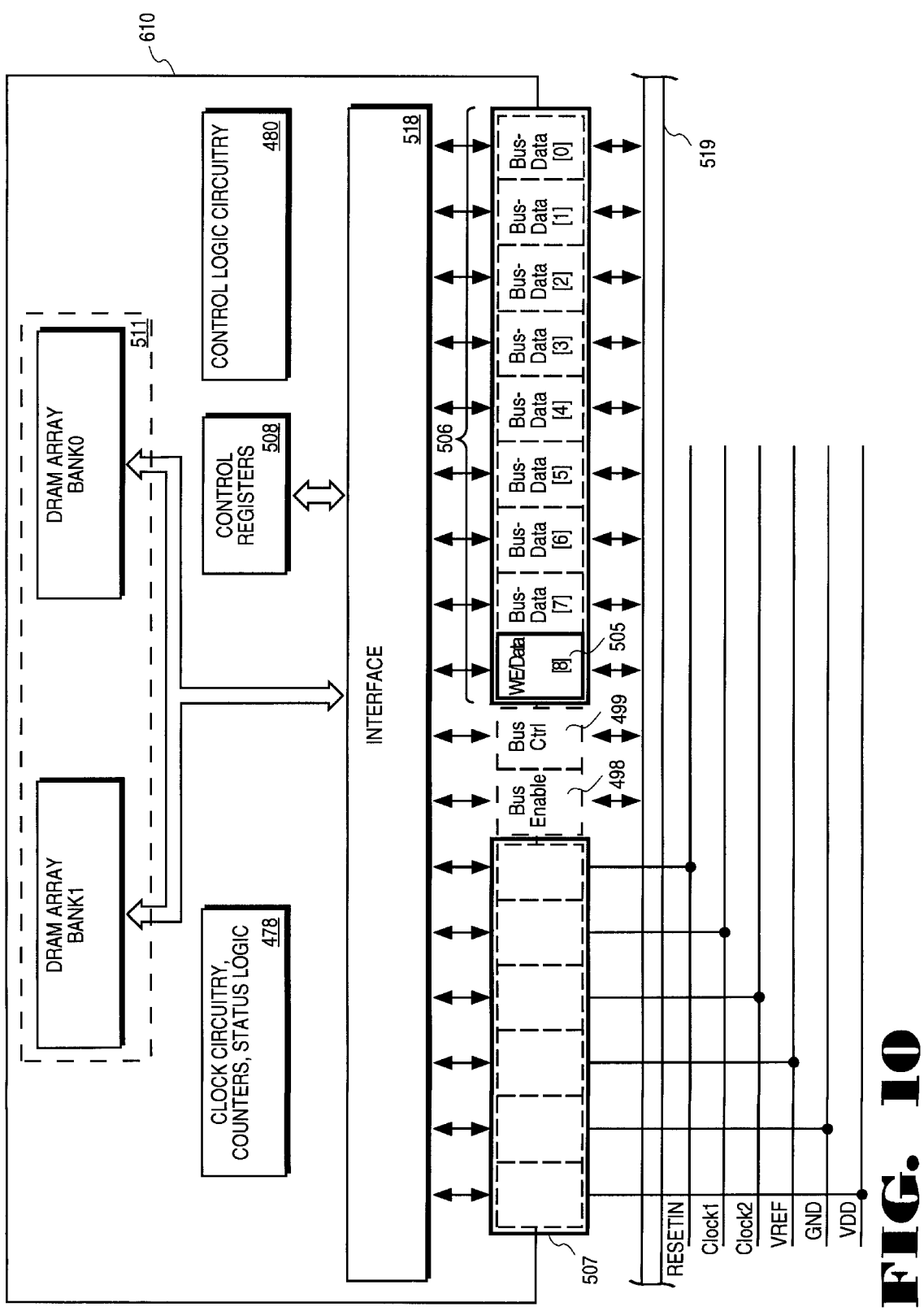
FIG. 10 is a block diagram of a DRAM with data/write-enable multiplexing.

FIG. 10 is a block diagram of DRAM 610, which is one of the DRAMs that is part of computer system 2000. DRAM 610 includes array 511 of storage cells organized into two banks, namely, Bank1 and Bank0. Interface 518 includes logic for processing and routing signals entering and leaving DRAM array 511. Control registers 508 store control information from a master device directing the operation of DRAM 610. DRAM 610 includes control logic circuitry 480 that controls various operations of DRAM 610. DRAM 610 also includes circuitry 478, which includes clock circuitry, counters, and status logic.

Pins 507 transfer reset signals, clock signals, voltage, and ground signals to DRAM 610. Pin 498 (BusEnable) and pin 499 (BusCtrl) transfer signals related to bus management.

Pins 506 comprise eight pins BusData[0] through BusData[7] plus ninth pin WE/Data[8], which can be used to transfer different signals at different times to DRAM 610 from bus 519 and from bus 519 to DRAM 610. Pins BusData[0] through BusData[7] plus WE/Data[8] can transfer data to be written to DRAM 610 and data read from DRAM 610. Pins 506 can also transfer Write Enable WE signals and Error Detection and Correction (EDC) signals, as described in more detail below. In short, pins 506, 498, and 499 allow communication between bus 519 and DRAM 610. Write enable information is sent to DRAM 610, but data can flow to or from DRAM 610.

Pin 505 (i.e., WE/Data[8]) is the ninth pin of pins 506 and is used in one embodiment for transferring data and WE signals. For one embodiment, pin 505 transfers a data signal that is an EDC signal. For another embodiment, pins BusData[0] through BusData[7] transfer eight data signals at some times and receive eight WE signals at other times. These embodiments are described below.

Control logic circuitry 480 ensures that write operations to DRAM array 511 are enabled or disabled depending upon the write enable signals received by DRAM 610. Control logic circuitry controls WE/Data [8] pin 505 and lets DRAM 610 distinguish between receiving WE information on pin 505 or sending or receiving data (including EDC information) on pin 505. Control logic circuitry 480 can also interpret whether WE bits are sent over pins BusData [0] through BusData [7] of pins 506. Control circuitry 480 can also decode packets sent over bus 506. For an alternative embodiment that includes a dedicated WE pin, control logic circuitry 480 looks to that dedicated WE pin for write enable information, and accordingly enables or disables write operations depending upon the write enable information received. Control logic circuitry 480 also can recognize a time gap between the WE information and the data that the WE information applies to. In short, control logic circuitry 480 provides the control for DRAM 610.

Figure 11:
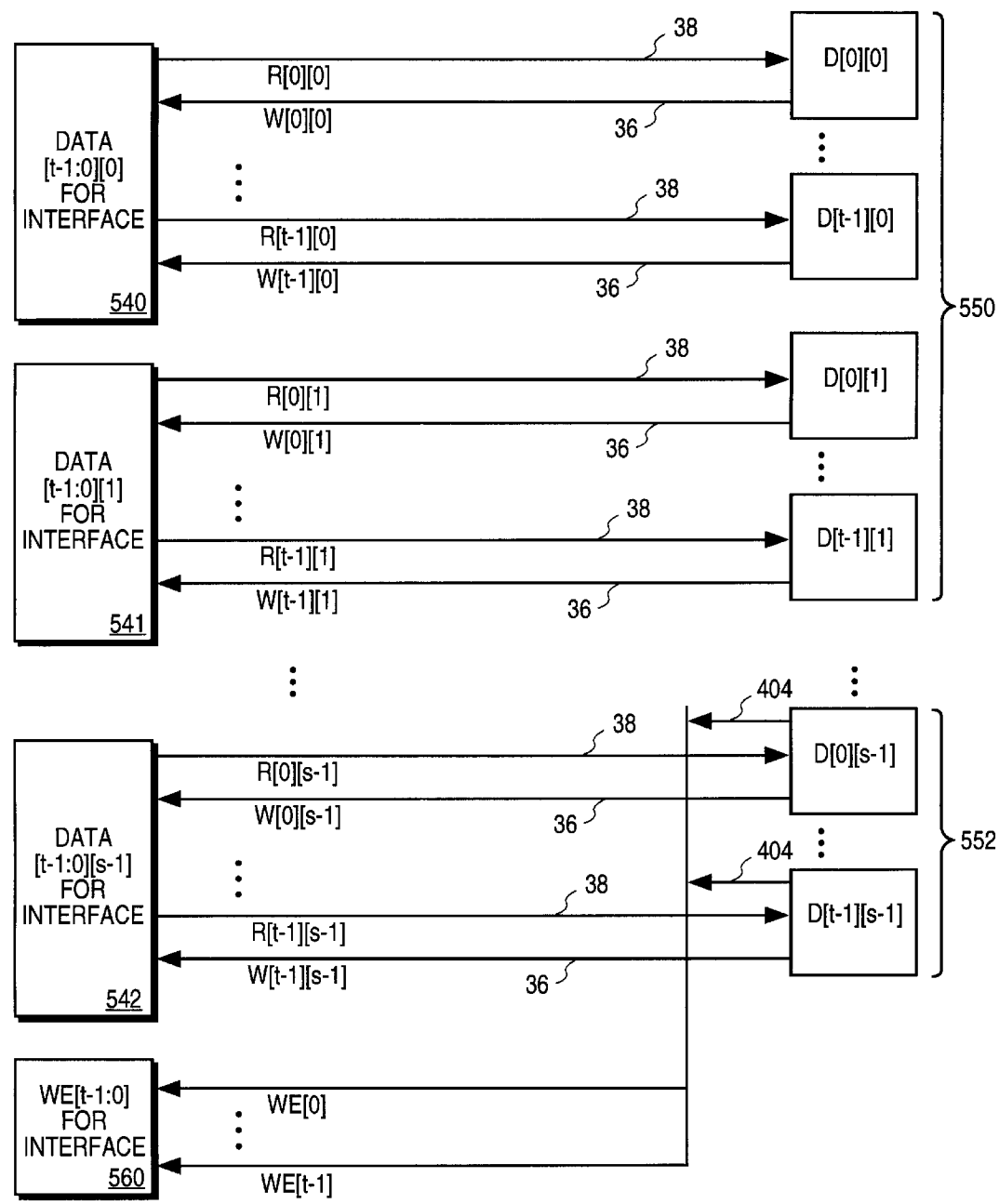
FIG. 11 shows a WE/data multiplexing scheme for a DRAM.

FIG. 11 shows the types 550 and 552 of data applied to pins 506 of DRAM 610. FIG. 11 also shows the types 540, 541, and 542 of data received by interface 518 of DRAM 610. Write enable information 560 is also received by interface 518 of DRAM 610. Data inputs 550 are bits of data D[0][0] through D[t-1][0] to be written to or read from DRAM array 511. Bits D[0][0] through D[t-1][0] represent the 0th bit of data from bytes 0 through t-1, or the 0th bit of each byte in a block of "t" bytes, wherein a block of "t" bytes is transferred in a CAS cycle. For one embodiment of the invention, "t" equals eight. For alternate embodiments, the DRAM could be two or more bytes wide. If, for example, the DRAM is two bytes wide, then two times t bytes are transferred in a CAS cycle.

Data bits 552 each comprise the "s-1th" bit of each byte in a block of data written to or read from DRAM 610. For one embodiment, each byte is a 9-bit byte (i.e., a X9 byte) and "s" equals nine. The "s-1th" bit is interpreted by DRAM 610 as write-enable ("WE") bit 404 instead of being written to the DRAM as a data bit 36. For a DRAM two or more bytes wide, there would be one such bit for each byte. For one embodiment, WE bit 404 is associated with the byte of data containing it. For another embodiment, WE bit 404 is associated with a byte of data in a block transferred following the transfer of the block containing WE bit 404. A data byte is also referred to as a data word.

Figure 12A:
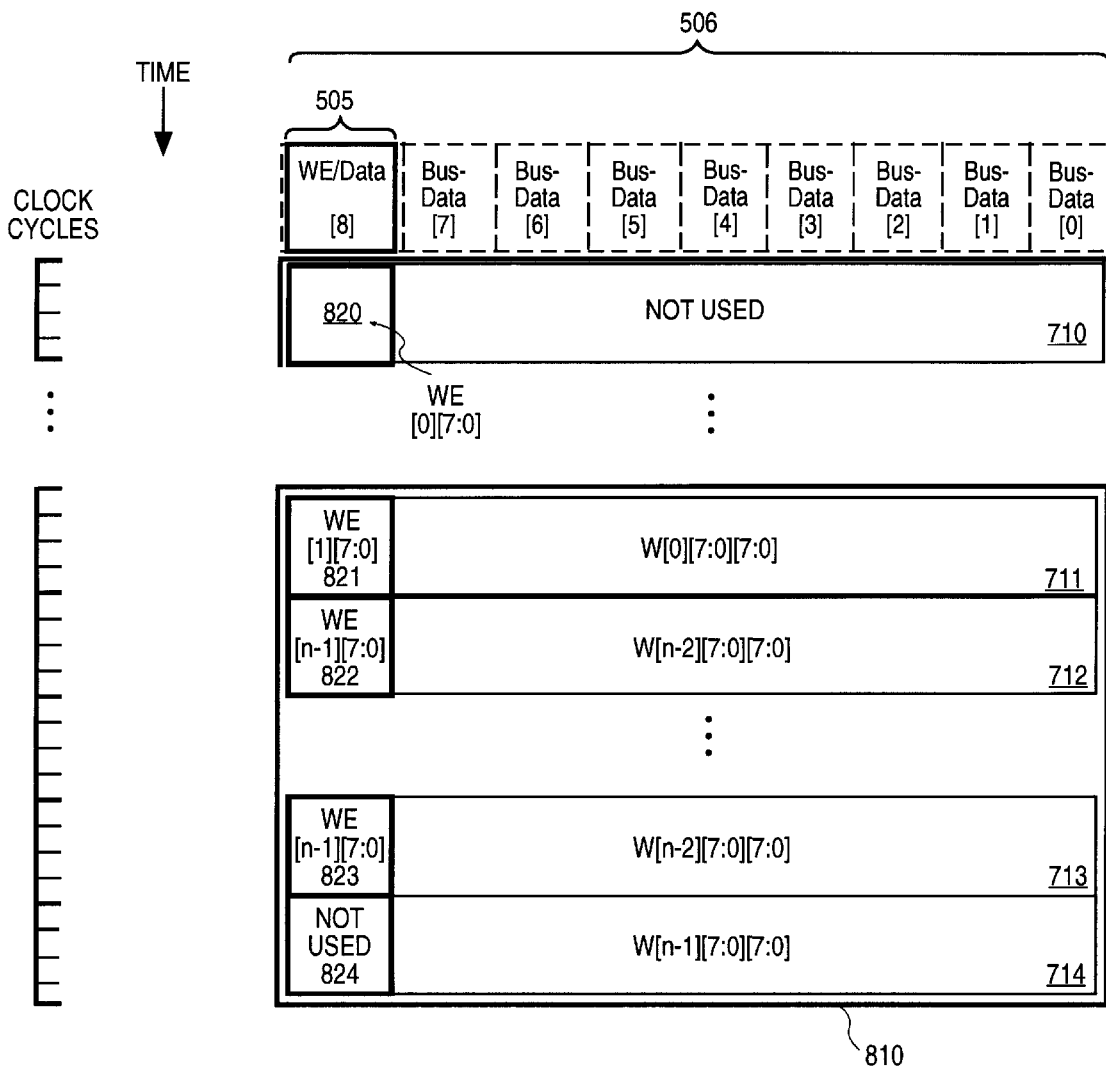
FIG. 12A illustrates a write transaction with a serial sequence of write enable signals.

FIG. 12A shows a write transaction over time using a serial sequence of write enable signals that are offset in time with respect to respective data. The information appearing over time on the nine device pins 506 of DRAM 610 during the transaction is shown. Pins BusData[0] through BusData [7] are used for data and pin WE/Data[8] is used for WE signals. Block 810 is nine bits wide—that is, "s" equals nine. Block 810 is comprised of (1) n write subblocks 711 through 714, (2) n−1 WE subblocks 821 through 823, and (3) unused subblock 824. WE subblock 820 is sent prior in time to block 810. Subblock 710 is not used. Write subblocks 711 through 714 contain data to be written to the DRAM and are each "t" bytes long and eight bits wide. For one embodiment, "t" equals eight. For example, the topmost write subblock 711 is the 0th block of n blocks to be written, containing eight words, 7 through 0, each word containing eight bits, 7 through 0.

For the embodiments of this invention, a single clock cycle has two phases, allowing two transfer operations to occur within a single clock cycle. For alternative embodiments, other clocking schemes may be used.

Each of WE subblocks 820 through 823 is "t" bytes long and one bit wide and contains WE bits. Subblock 824 is not used. Each WE subblock is comprised of WE bits associated with a subsequent write subblock—i.e., a write subblock that appears during a later clock cycle in time. For instance, the WE subblock 820 contains information pertinent to write subblock 711. WE subblock 820 contains eight WE bits 7 through 0 indicating whether the 0th through 7th words of write subblock 711 are to be written or not. When a data word of write subblock 711 is written, the associated WE bits of WE subblock 821 are read by the DRAM. Thus, the WE bits are "collected" in serial and stored for use with the following write subblock. Because the WE bits are transferred with the write subblock ahead in time of the write subblock to which the WE bits refer, no WE bits need be sent in the final time slot during which the final write subblock 714 is transferred. Therefore, the final subblock 824 is not used. Also, in this arrangement, data subblock 710 is not used because the first WE subblock—i.e., subblock 820—is being sent at that point in time, and subblock 820 is associated with write subblock 711, which arrives at the DRAM at a later point in time.

The time after the transfer of subblock 820, indicated by ellipses, represents a time gap of variable length. For one embodiment, the time gap is present, but for other embodiments, there is no time gap. For the embodiment with this time gap, other memory transactions can be interleaved into this time gap. In other words, other memory transactions can occur before WE subblock 821 write subblock 711 are received. Because the WE bits of subblock 820 referring to write subblock 711 are transferred ahead of write subblock 711 and held in registers, pin WE/Data[8] is "free" immediately after transfer of subblock 820. Pin WE/Data [8] (i.e., pin 505) can be used either for write enable information, for command and control information, or for data. In other words, pin 505 is multiplexed. This embodiment thus makes interleaving of other memory operations easier for a controller to manage. For instance, it is not necessary for a controller to be concerned whether a data transaction is eight bits or nine bits wide because all nine data pins are available.

Figure 12B:
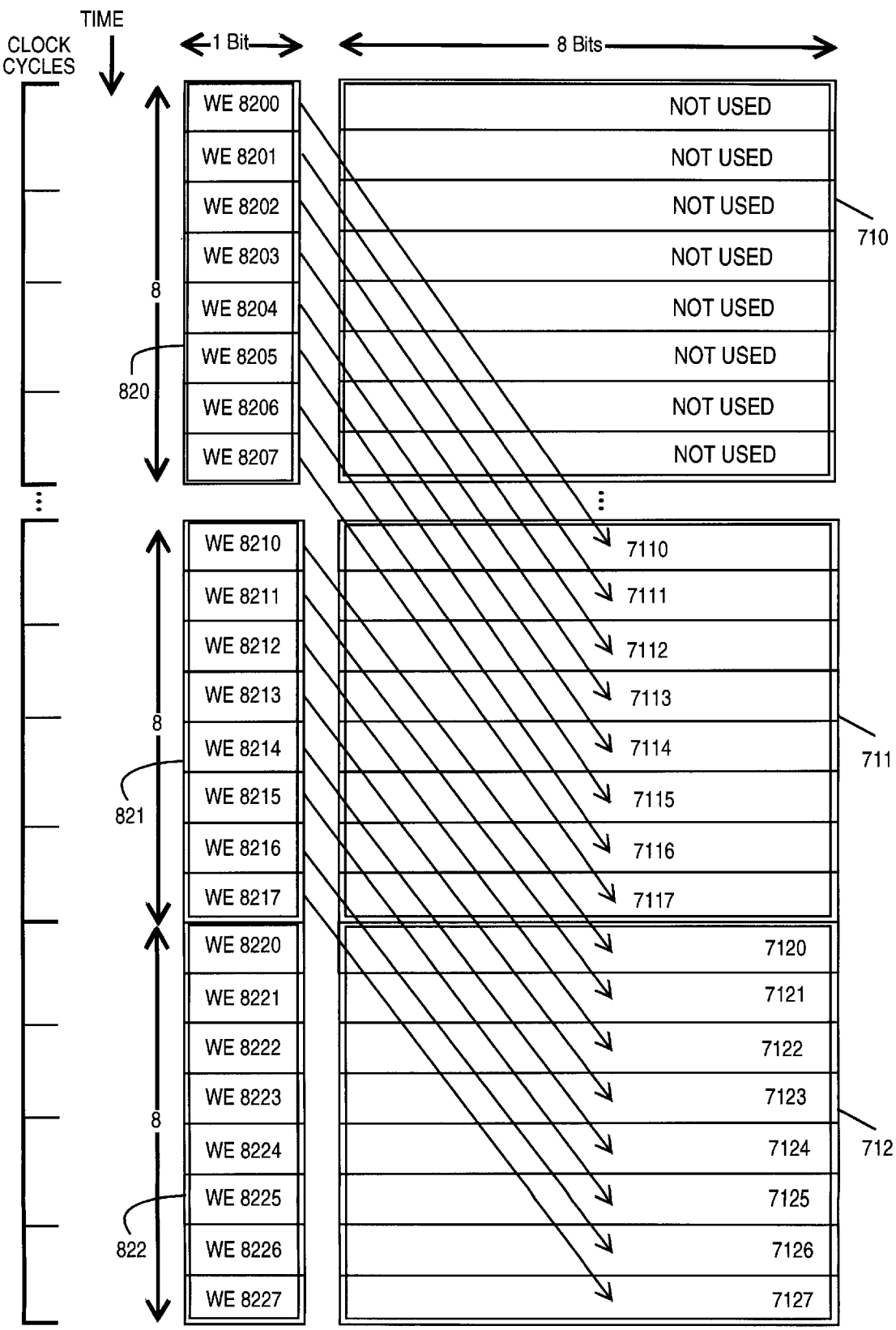
FIG. 12B illustrates the relationship between WE bits and data bytes in a write transaction with a serial sequence of write enable signals.

FIG. 12B shows the relationship between serial WE bits and data words of write subblocks. Write subblocks 710, 711, and 712 are shown along with WE subblocks 820,821, and 822. Write subblock 710 is not used to send data words for this embodiment. Write subblock 711 is comprised of eight eight-bit data words 7110 through 7117. Write subblock 712 is comprised of eight eight-bit data words 7120 through 7127. WE subblock 820 contains eight WE bits 8200 through 8207. WE subblock 821 contains eight WE bits 8210 through 8217. WE subblock 822 contains eight WE bits 8220 through 8227.

The serial stream of WE bits 8200 through 8207 of WE subblock 820 are sent from the DRAM master 2002. The eight WE bits 8200 through 8207 are received by WE/Data pin [8] of DRAM 610 and then stored internally in registers within interface 518. WE bit 8200 indicates whether data word 7110 is to be written or not. Similarly, WE bits 8201 through 8207 indicate whether respective data words 7111 through 7117 are to be written or not. Write subblock 711 is received by the DRAM after the time gap.

Also after the time gap, a serial stream of write enable bits 8210 through 8217 of WE subblock 821 are received by DRAM 610 and stored internally in registers within interface 518, replacing the WE bits previously stored there. WE bits 8210 through 8217 indicate whether subsequent respective data words 7120 through 7127 of write subblock 712 are to be written or not. WE subblock 822 is comprised of WE bits for a write subblock following write subblock 712. Thus, as shown, DRAM 610 receives a serial sequence of WE bits that are offset in time with respect to respective data received by pins BusData [0] through BusData [7].

Figure 1:
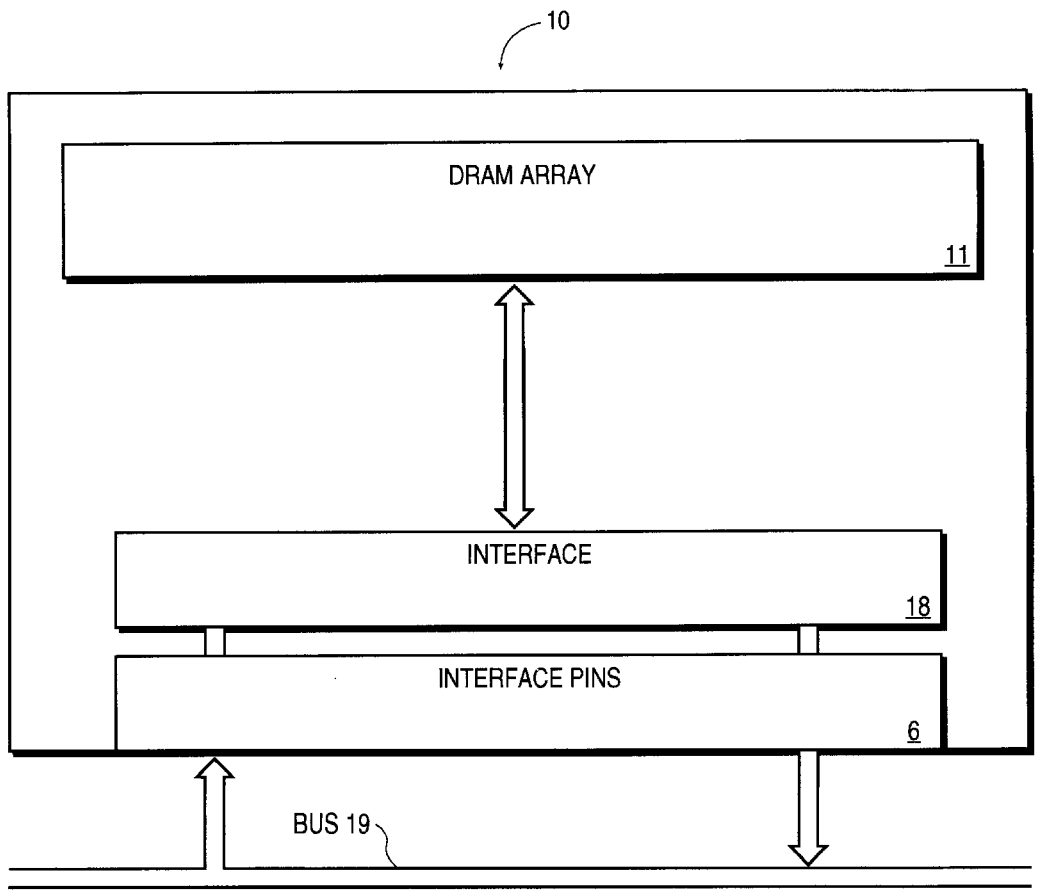
FIG. 1 is a block diagram of a prior DRAM.
Figure 2:
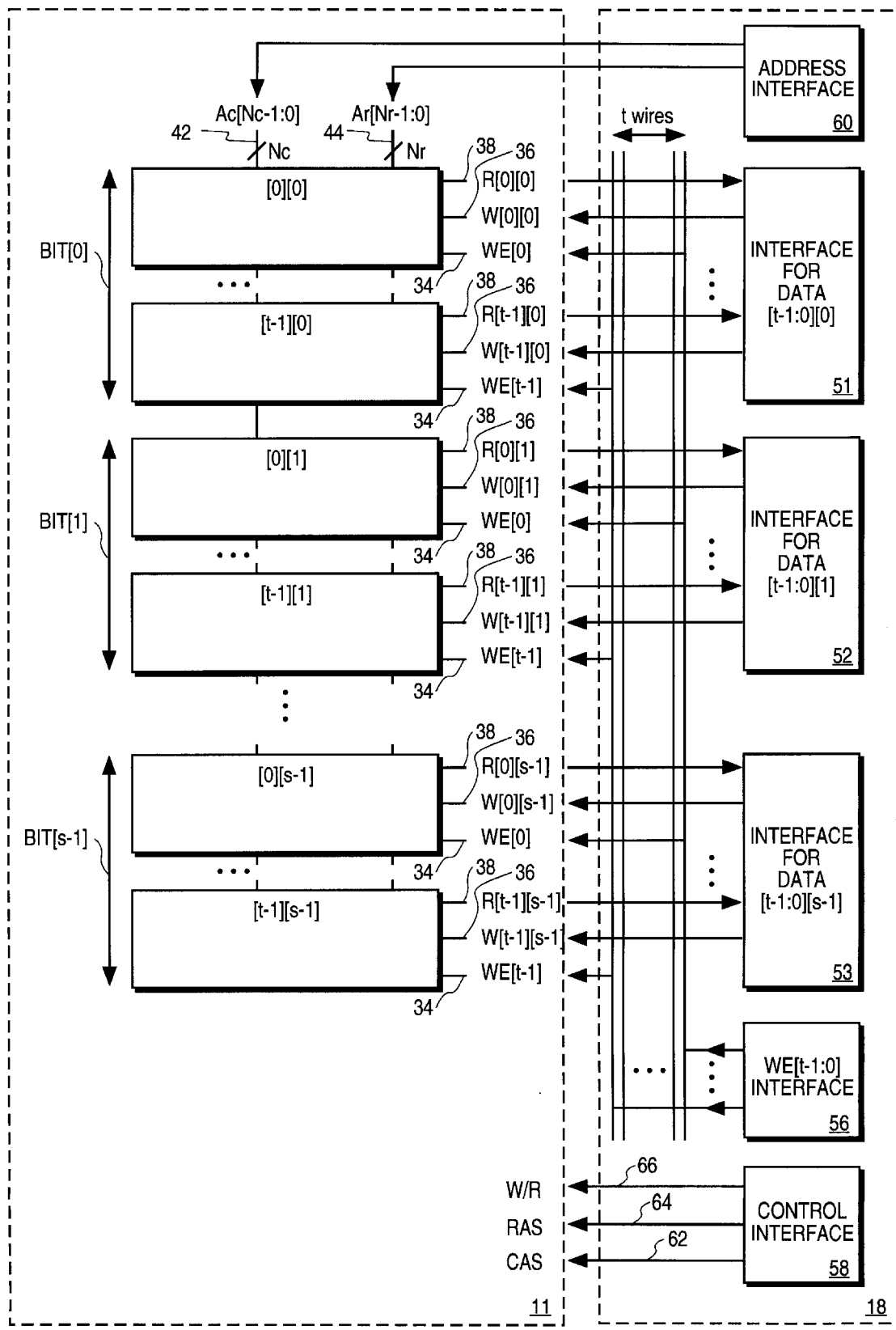
FIG. 2 shows the connection of the storage area of a prior DRAM array to the DRAM interface.
Figure 3:
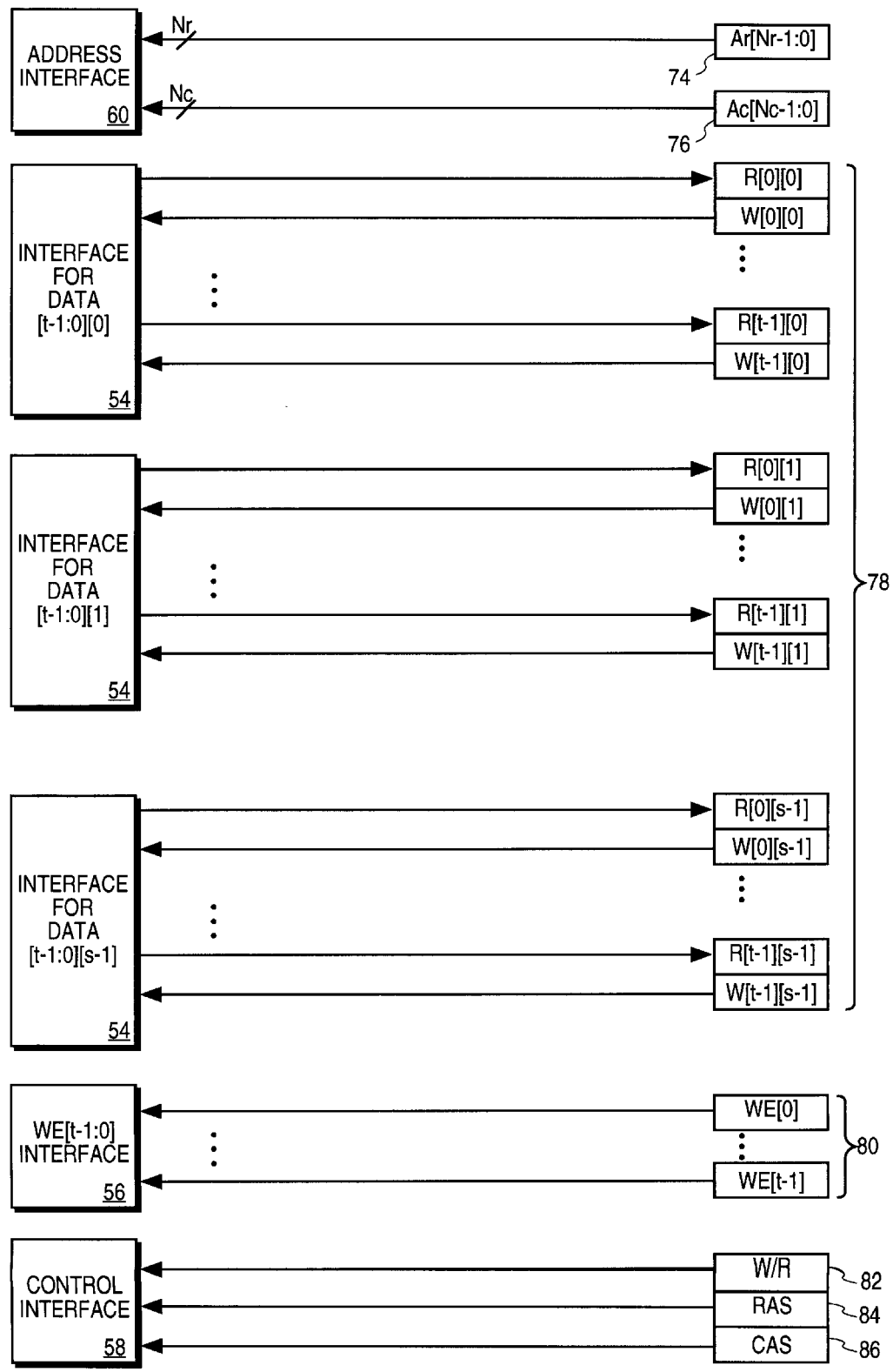
FIG. 3 shows a prior DRAM arrangement with no multiplexing.
Figure 4:
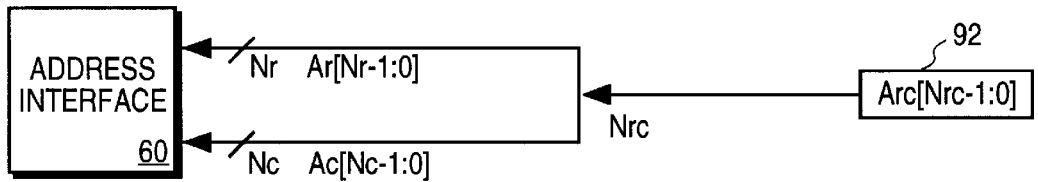
FIG. 4 illustrates prior column/row multiplexing of a DRAM.
Figure 5:
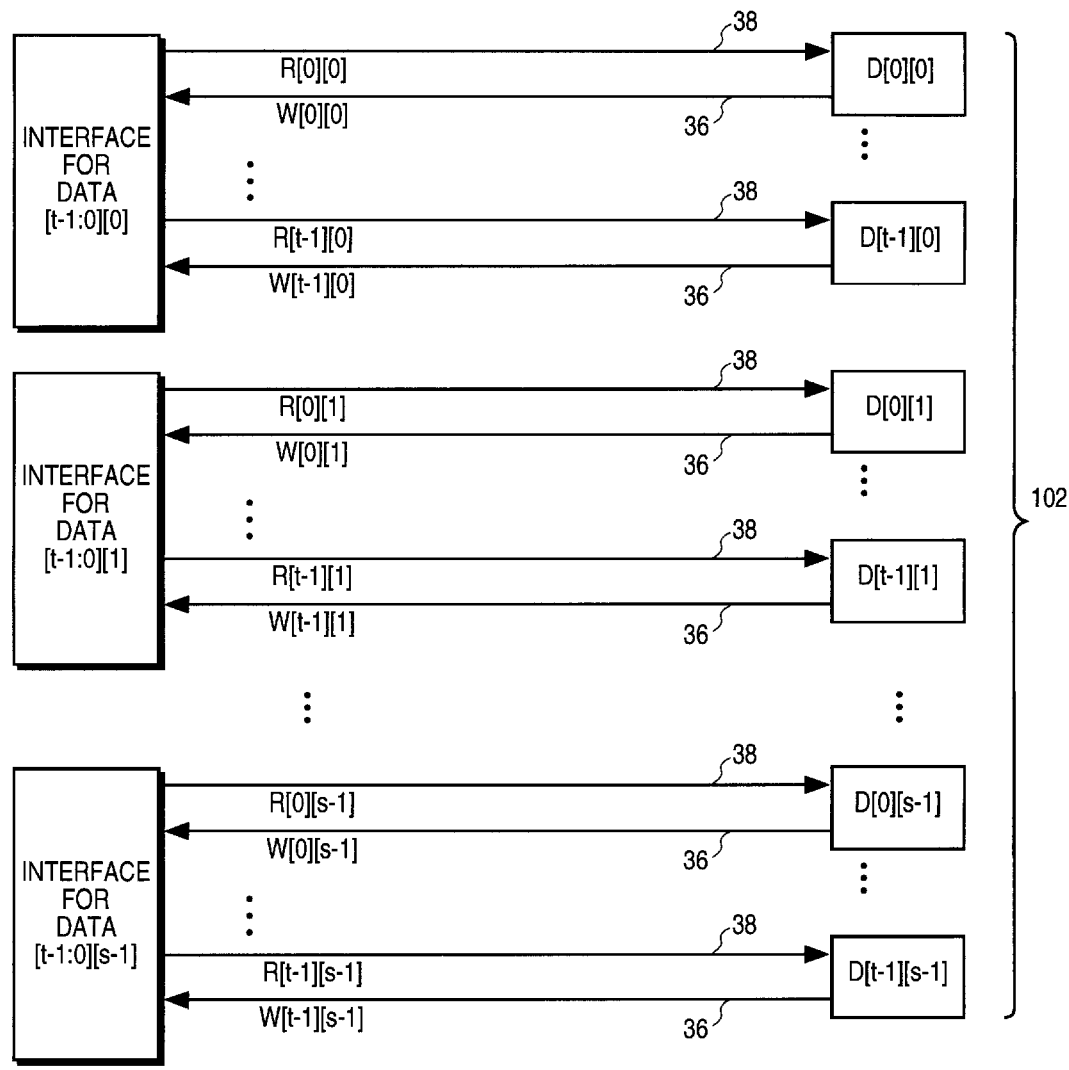
FIG. 5 illustrates prior data in/out multiplexing.
Figure 6:
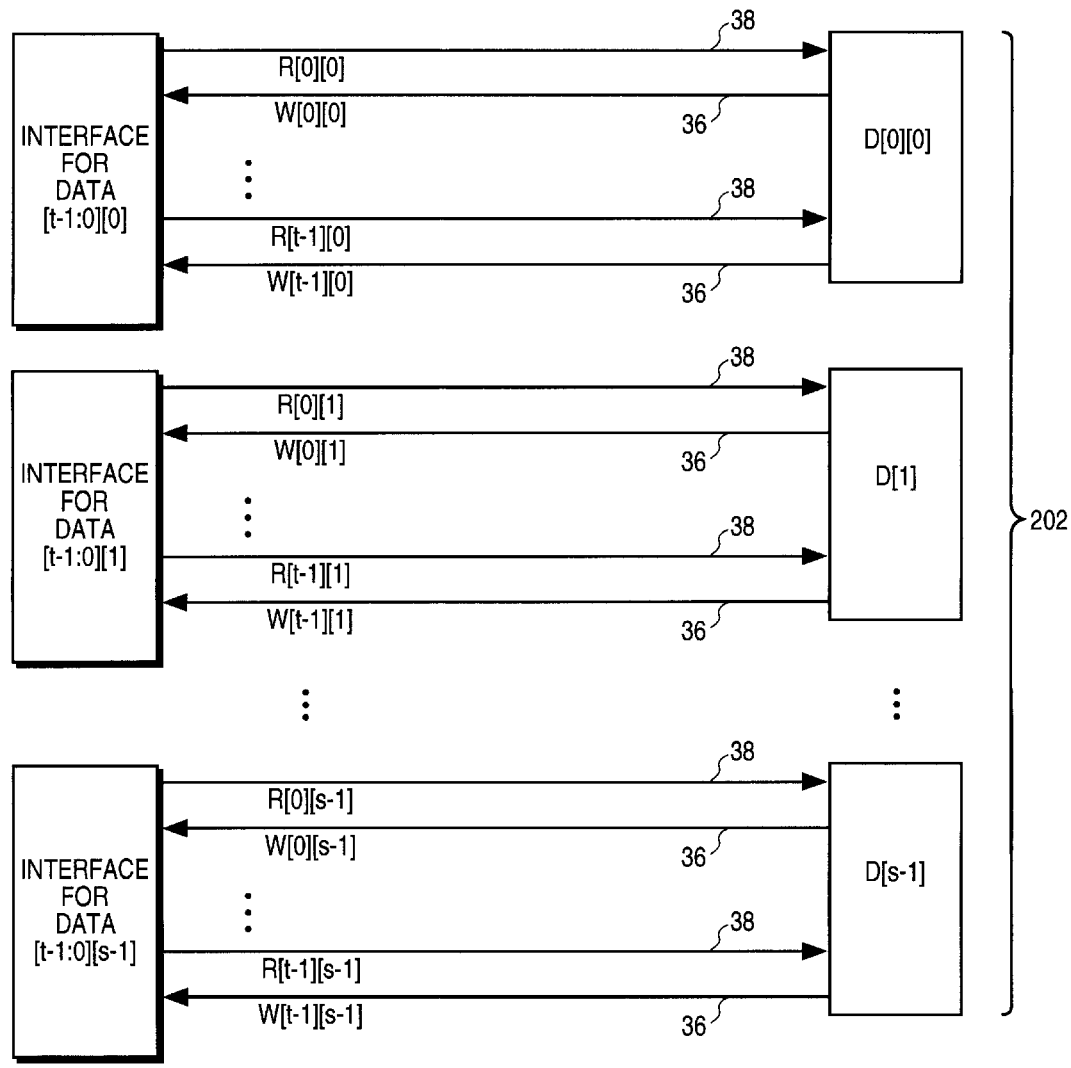
FIG. 6 shows a prior data byte multiplexing scheme.
Figure 7:
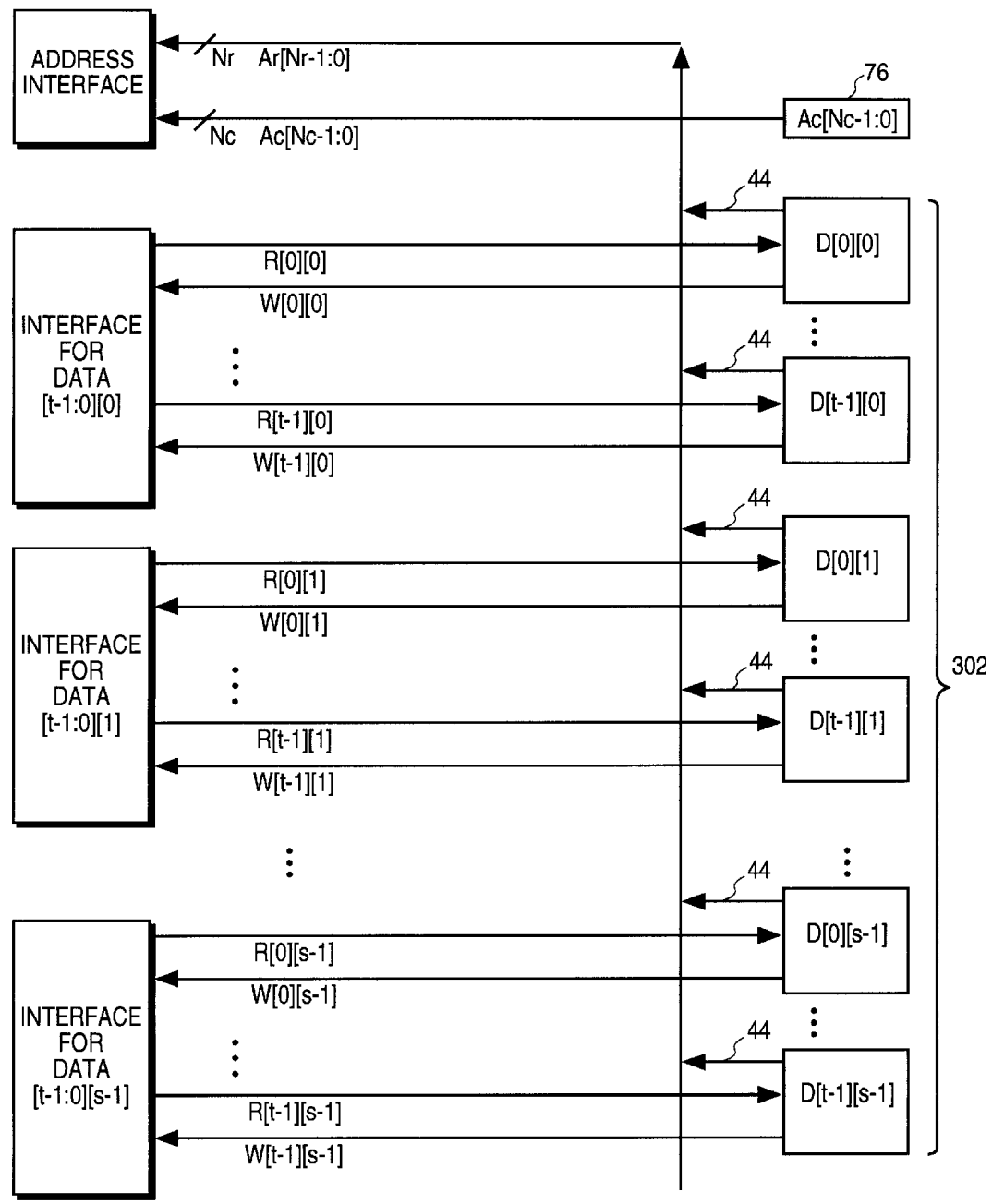
FIG. 7 illustrates a prior data/address multiplexing scheme.

For the embodiment described above, a dedicated WE pin is not necessary and can be eliminated. Instead, the ninth pin of pins 506—i.e., pin 505, also referred to as pin WE/Data [8] (shown in FIG. 1A)—is used for receiving WE bits. Moreover, data can be sent or received over pin 505 when WE bits are not being sent over pin 505—for example, in the time gap between the receipt of subblock 820 and subblock 821.

Figure 8A:
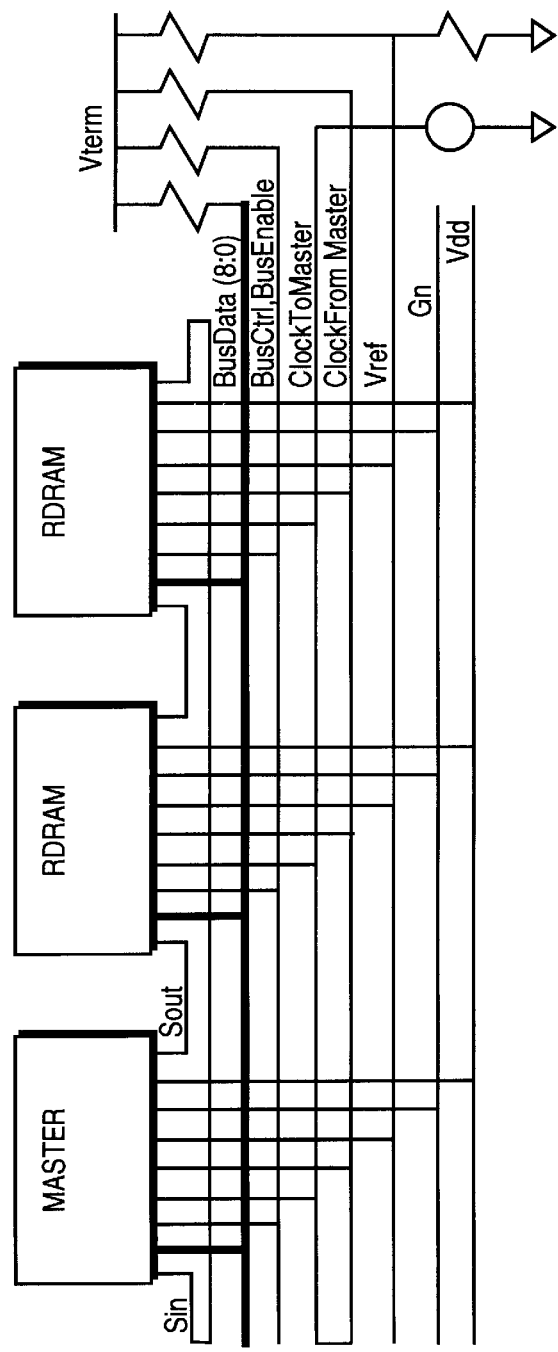
FIG. 8A shows a memory storage system using Rambus DRAMs.
Figure 8B:
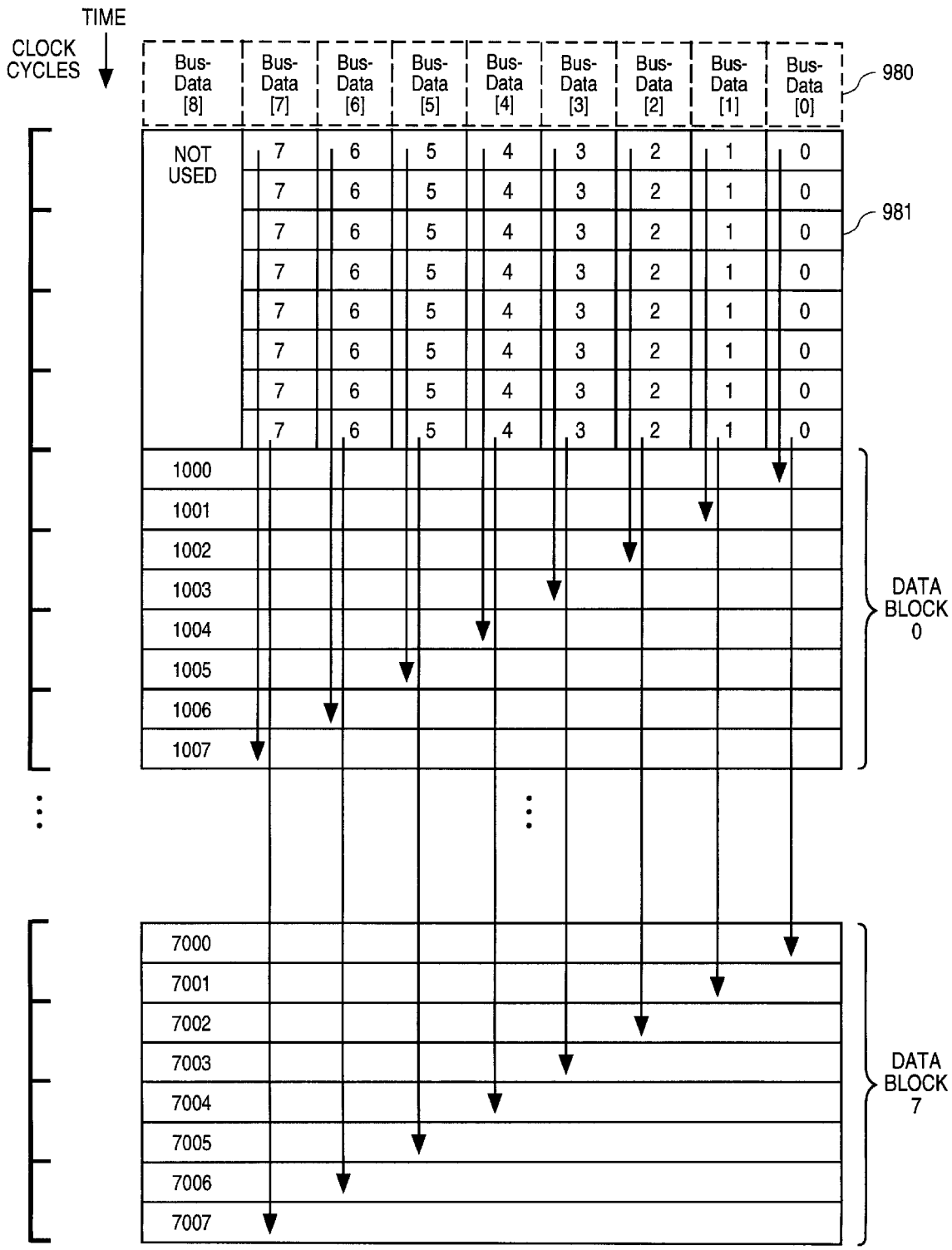
FIG. 8B shows a prior configuration for a Rambus DRAM for multiplexing WE bits with data bits.

The use of serial stream of WE bits (as shown in FIG. 12B) rather than an eight-bit wide WE word such as used by the prior art configuration shown in FIG. 8B means that a potentially infinite stream of subsequent data words can be sent to the DRAM to be written without being interrupted. In other words, data words do not need to be interrupted in order to send write enable information to the DRAM. Instead, the DRAM receives a continuous stream of WE bits that are offset from the respective data words.

For another embodiment, however, a serial stream of WE bits are sent to a pin dedicated to WE bits. That dedicated WE pin does not receive data. The serial sequence of WE bits are offset in time, however, with respect to respective data words received by the bus data pins of the DRAM. In other words, the WE bits and the write data words have the same relationship in time as those shown in FIG. 12B. The difference is that for the alternative embodiment, only WE bits can be sent to a dedicated WE pin. For example, for one alternative embodiment, pin 505 would be only able to receive WE bits and not receive data. Data would only be eight bits wide in view of the eight data pins BusData [0] through BusData [7]. That alternative embodiment still provides the advantage of having a serial stream of WE bits rather than periodic WE information. In other words, for that alternative embodiment, data words do not need to be interrupted in order to send write enable information to the DRAM, given that a serial stream of WE bits is sent to the DRAM offset with respect to the data. For another alternative embodiment, the dedicated WE pin could be an additional pin other than pin 505, and pins 506—including pin 505—could receive or send data. If a dedicated pin other than one of pins 506 is used for WE information, then eight bit or nine bit wide data words can be sent over pins 506.

Figure 13A:
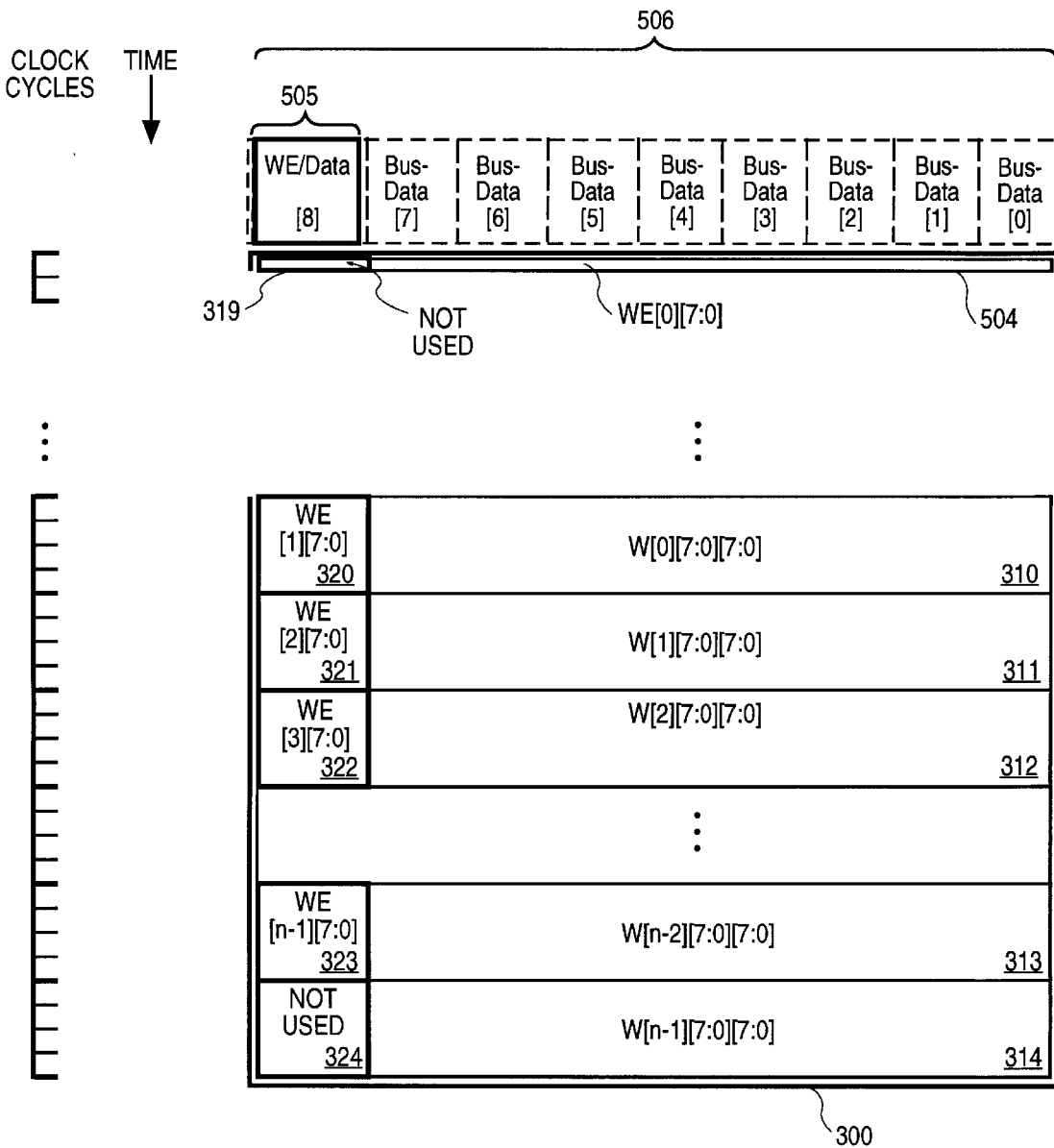
FIG. 13A illustrates a write transaction with parallel WE signals and serial WE signals.

FIG. 13A shows a write transaction over time using initial write enable signals sent in parallel and subsequent write enable signals sent serially.

Prior to block 300 being sent, WE mask 504 is sent. WE mask 504 is also referred to as WE subblock 504. Subblock 319 is not used. WE mask 504 is 8 bits wide and one word long. Unused subblock 319 is one bit wide and one word long.

Block 300 is nine bits wide and is comprised of (1) n write subblocks 310 through 314, (2) WE subblocks 320 through 323, and (3) unused subblock 324. Write subblocks 310 through 314 are "t" words long and eight bits wide. For one embodiment, "t" is eight. WE subblocks 320 through 323 are "t" words long and one bit wide.

The eight bits 7 through 0 of WE mask 504 indicate whether each respective byte of bytes 7 through 0 of write subblock 310 will be written or not. Again, a data byte is also referred to as a data word. Only eight WE bits are required for the eight bytes of subblock 310. Therefore, subblock 319 is not used.

The time after the transfer of WE mask 504, indicated by ellipses, represents a time gap of variable length. For one embodiment, the time gap is present, but for other embodiments, there is no time gap. For the embodiment with this time gap, other memory transactions can be interleaved into this time gap.

WE subblock 320 is one bit wide. WE subblock 320 includes a serial chain of eight WE bits 7 through 0 indicating whether each of the eight bytes of write subblock 311 will be written or not. Similarly, WE subblock 321 refers to the write subblock 312, which is the write subblock following write subblock 311. Because WE subblock 323 includes WE bits for final write subblock 314, subblock 324 is not used.

For WE mask 504, WE signals are transferred on pins BusData[0] through BusData[7] in parallel. For WE subblocks 320 through 323, WE signals are transferred on pin 505 (WE/Data[8]) in serial.

Figure 13B:
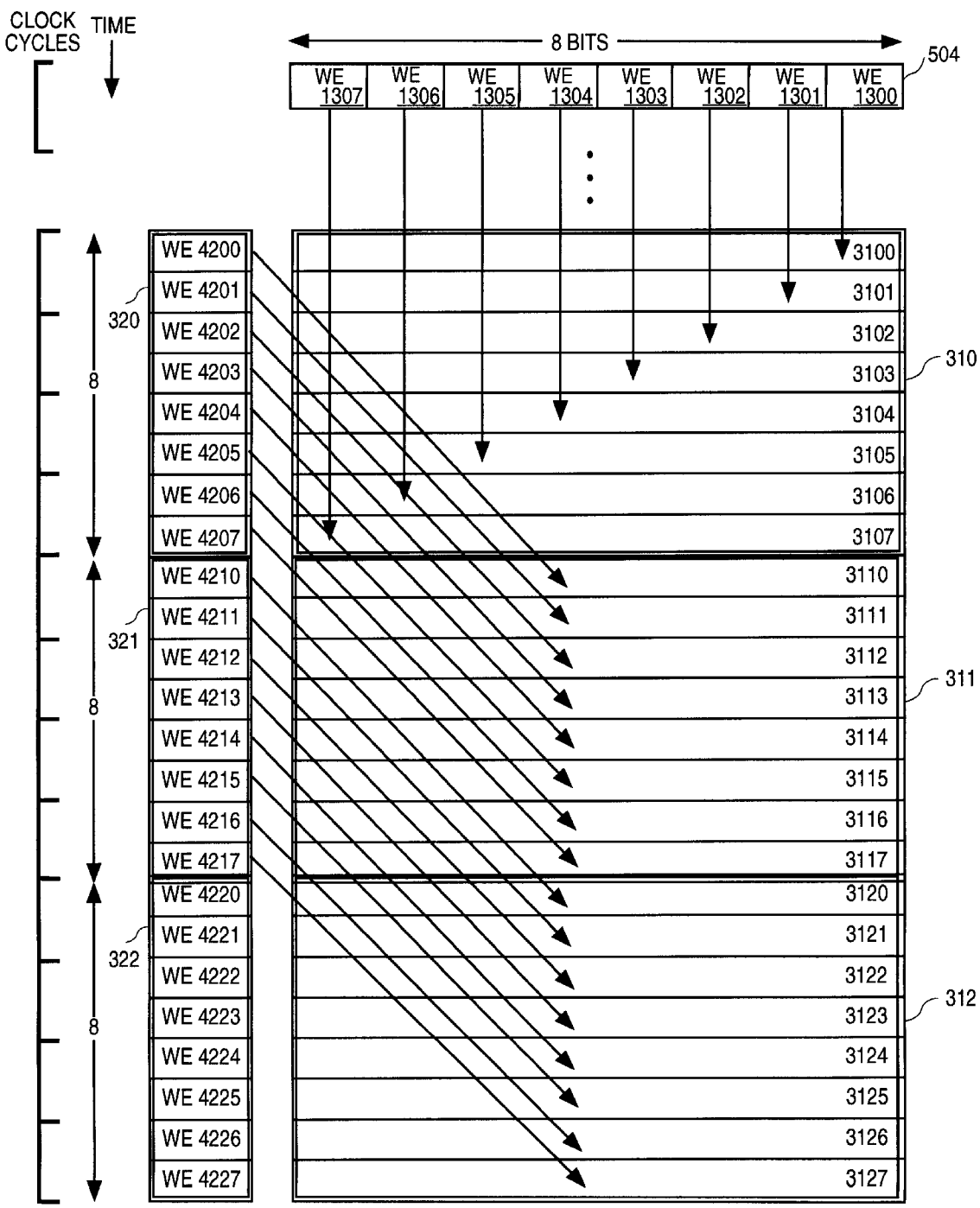
FIG. 13B illustrates the relationship between WE bits and data bytes in a write transaction with parallel WE signals and serial WE signals.

FIG. 13B shows the relationship between parallel and serial WE signals and data words. WE mask 504 is an eight bit word comprised of WE bits 1300 through 1307. Write subblocks 310, 311, and 312 are each comprised of eight data words. Each data word is eight bits wide. WE subblocks 320, 321, and 322 each comprise eight one-bit words. When WE mask 504 is transferred to the DRAM 610 from DRAM master 2002, WE bits 300 through 307 are stored in registers on DRAM 610 for use with write subblock 310. Data word 3100 is transferred to DRAM 610 after a time gap. As data word 3100 is transferred to DRAM 610, WE bit 1300 indicates whether data word 3100 is written or not. Similarly, WE bits 1301 through 1307 indicate whether or not respective data words 3101 through 3107 are written or not. Also, as data words 3100 through 3107 of write subblock 310 are transferred to DRAM 610, a serial stream of WE bits 4200 through 4207 are stored in registers on the DRAM for use with write subblock 311. WE bit 4200 indicates whether data word 3110 of write subblock 311 is written or not. Similarly, WE bits 4201 through 4207 indicate whether respective data words 3111 through 3117 are written or not. WE subblock 321 is comprised of WE bits 4210 through 4217 pertaining to respective data words 3120 through 3127 of write subblock 312. WE subblock 322 is comprised of WE bits 4220 through 4227 pertaining to respective data words of a write subblock following write subblock 312.

For the embodiment described above, a separate dedicated WE pin is not necessary and is not part of the DRAM design. Instead, the ninth WE/Data pin 505 (shown in FIG. 13A) is used for receiving the serial stream of WE bits making up WE subblocks 320 through 323. Moreover, data can be sent over pin 505 or received by pin 505 when WE bits are not being sent over pin 505—for example, in the time gap between the receipt of WE mask 504 and the receipt of subblock 320. Data words that are eight bits or nine bits wide are possible when WE bits are not being sent.

Although the embodiment shown in FIG. 13A does use parallel WE bits that comprise WE mask 504, those WE bits need only be stored in eight registers of DRAM 610. One advantage of starting write operations with the WE mask 504 is that the eight parallel WE bits of WE mask 504 are received by the DRAM in only one-half of a clock cycle. This permits the interleaved memory operations, which occur in the time gap before write subblock 310, to occur sooner than if the initial WE bits were sent serially. Accordingly, write subblock 310 can also be sent sooner because the interleaved memory operations end sooner.

Although WE mask 504 permits a "quick start," the subsequent use of a serial stream of WE bits of subblocks 320 through 323 permits a potentially infinite stream of subsequent data words to be sent to the DRAM and written without being interrupted. There is no requirement that the parallel WE mask 504 be sent again to enable writes. The serial stream of WE bits allows the data words to keep being written to the DRAM. The DRAM receives a continuous stream of WE bits that are offset from the respective data words.

For another embodiment, however, the serial stream of WE bits of WE subblocks 320 through 324 are sent to a pin dedicated to receiving WE bits. That dedicated WE pin does not receive data. The serial sequence of WE bits are, however, offset in time with respect to the data words received by the bus data pins, in the same manner as shown in FIG. 13B. For one embodiment, the dedicated WE pin could be pin 505, meaning that only pins BusData [0] through BusData [7] could receive data. For another embodiment, that dedicated WE pin could be a pin other than pin 505, and all of pins 506—including pin 505—could receive data. Whether or not the dedicated WE pin is pin 505, WE mask 506 would still be used to send the initial stream of parallel WE bits.

Figure 14:
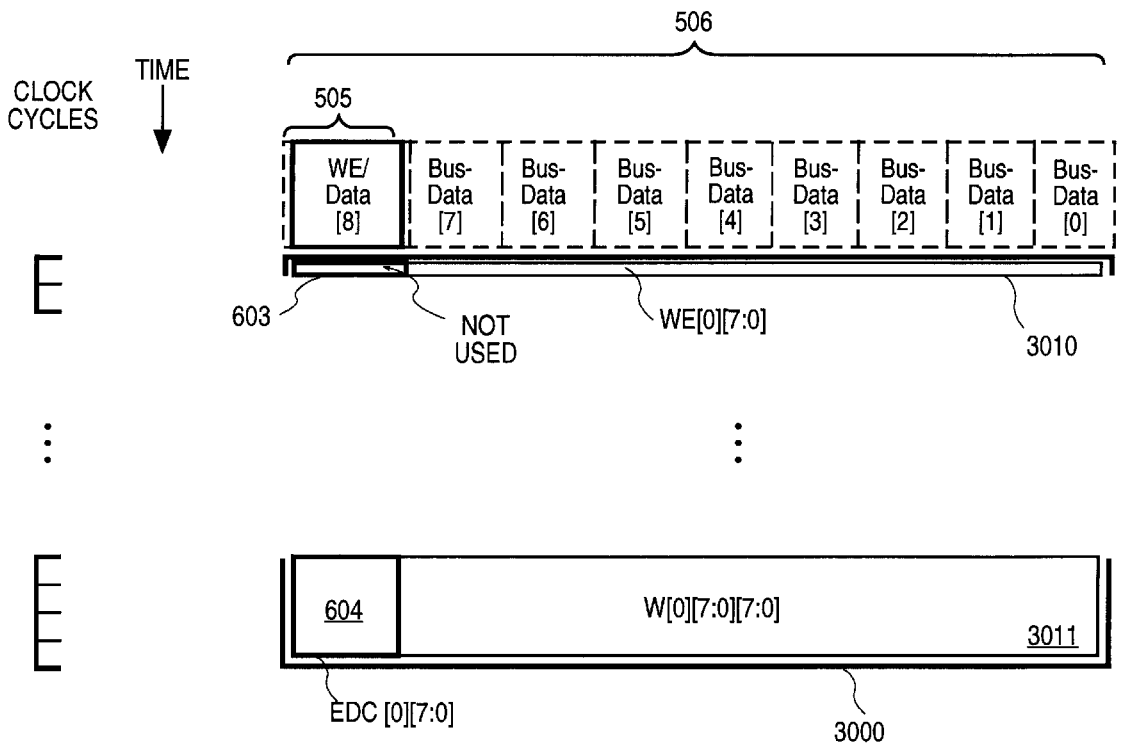
FIG. 14 illustrates a write transaction with the multiplexing of EDC information, data, and WE information.

Another embodiment of the invention is a scheme that permits the multiplexing of EDC, data, and WE information. A one-block write transaction using this embodiment is shown in FIG. 14. Block 3000 includes EDC subblock 604 and write subblock 3011. For one embodiment, write subblock 3011 is comprised of eight data words, each data word being eight bits wide. EDC subblock 604 is eight words long and one bit wide. Each bit of subblock EDC 604 is an EDC bit associated with write subblock 3011. Subblock EDC 604 can be comprised of parity bits or ECC bits.

WE mask 3010 is one word made up of eight WE bits. Each bit of WE mask 3010 indicates whether a respective data word of the eight data words of write subblock 3011 is to be written or not written. Subblock 603 is not used.

The time gap shown by ellipses can be used for interleaving of other memory information. For an alternative embodiment, there is no time gap between WE mask 3010 and write subblock 3011.

If EDC subblock 604 is comprised of parity bits, then both parity and WE are available for write subblock 3011. Thus it is possible, for the case of a one block write operation, to use parity and avoid R/M/Ws without providing a dedicated WE pin.

For one embodiment of the invention, a serial stream of WE bits can be sent to pin 505 in FIG. 14 after EDC subblock 604 is sent. Moreover, pin 505 can also be used to send or receive data other than EDC information (EDC information being a type of data). In other words, pin 505 provides the capability of receiving WE information, or sending and receiving data and EDC information, at various points in time. This provides the memory system with flexibility and avoids the use of a dedicated WE pin.

Figure 15:
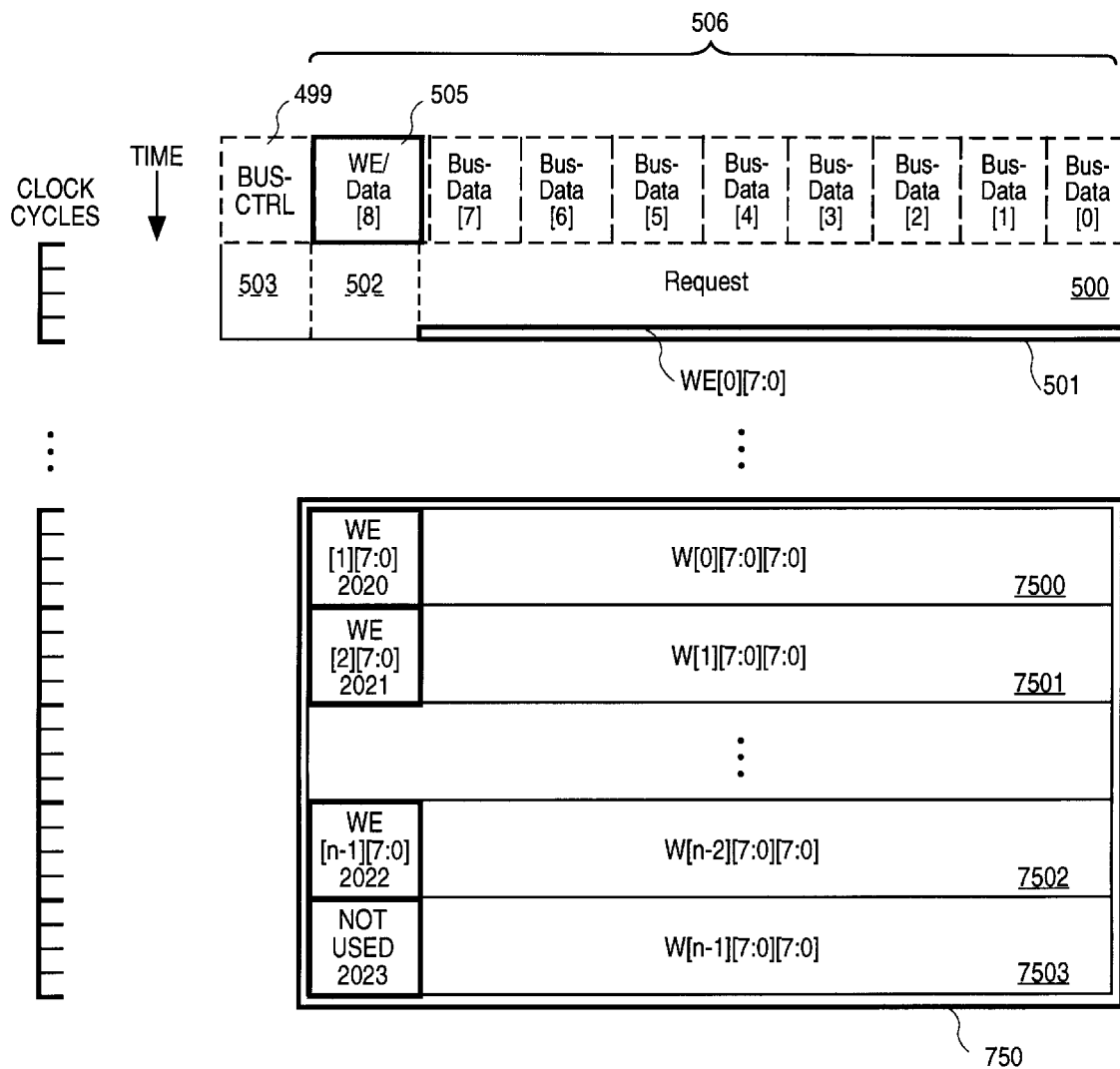
FIG. 15 illustrates a write transaction with parallel WE signals in a request packet followed by serial WE signals.

The embodiment of the invention shown in FIG. 15 functions in a manner similar to the embodiment shown in FIG. 13A, with the distinction that in FIG. 15 a DRAM request packet 500 is used to send a WE mask 501. FIG. 15 shows a write transaction with request packet 500, which is transmitted on bus 519 from DRAM 2002 master to DRAM 610, for example. Request packet 500 is configurable by DRAM master 2002 and contains information related to the DRAM operation to be performed. For example, request packet 500 includes read, write, and address information, among other information. The request packet information makes up multiple words of variable width. For the embodiment of FIG. 15, request packet 500 is ten bits wide. Eight bits of request packet 500 use pins BusData[0] through BusData[7] and one bit uses pin 505, which is WE/Data pin[8]. One bit of request packet 500 uses bus control pin 499 of DRAM 610. Words comprising control information are contained in subblocks 503 and 502. The final word of request packet 500 comprises WE mask 501.

Block 750 comprises write subblocks 7500 through 7503 and WE subblocks 2020 through 2022. For one embodiment, write subblock 7500 is comprised of eight data words, each data word being eight bits wide. The other data words 7501 through 7503 are each also comprised of eight data words. Subblock 2023 is not used.

WE mask 501 is one word that is eight bits wide. WE mask 501 is also referred to as WE subblock 501. Each bit of WE mask 501 indicates whether a respective byte of write subblock 7500 is written or not.

The time gap following request packet 500 can be used for interleaving data related to other memory operations. For an alternative embodiment, there is no time gap.

WE subblock 2020 comprises eight WE bits. Each bit of WE subblock 2020 indicates whether a respective data word of write subblock 7501 is to be written to the DRAM or not. WE subblocks 2021 through 2022 perform similar write enable functions for the rest of respective write subblocks of block 750 (i.e., write subblocks 7502 and 7503).

For the embodiment shown in FIG. 15, pin 505 is used for either write enable information or for data. For example, data can be sent over pin 505 during the time gap between WE mask 501 and write subblock 7500. Pin 505 can also be used for EDC information. For an alternative embodiment, however, a dedicated WE pin is used to receive the serial WE information contained in WE subblocks 2020 through 2022. The dedicated WE pin only receives write enable information, and cannot send or receive data or EDC information. For one alternative embodiment, the dedicated pin is pin 505. For another alternative embodiment, the dedicated WE pin is a separate pin that is not one of pins 506.

The various embodiments shown in FIGS. 12A, 12B, 13A, 13B, 14, and 15 do not require dedicated WE pins. For alternative embodiments, those schemes are used in memories with dedicated WE pins. In each of the embodiments described, WE signals are made available before the data to which they refer, thus making it unnecessary to provide registers for data awaiting WE signals. Registers are also conserved over prior methods because a maximum of eight WE signals need be registered at one time with the above described embodiments as opposed to, for example, 64 WE signals as in the prior method described with respect to FIG. 8B.

Figure 16A:
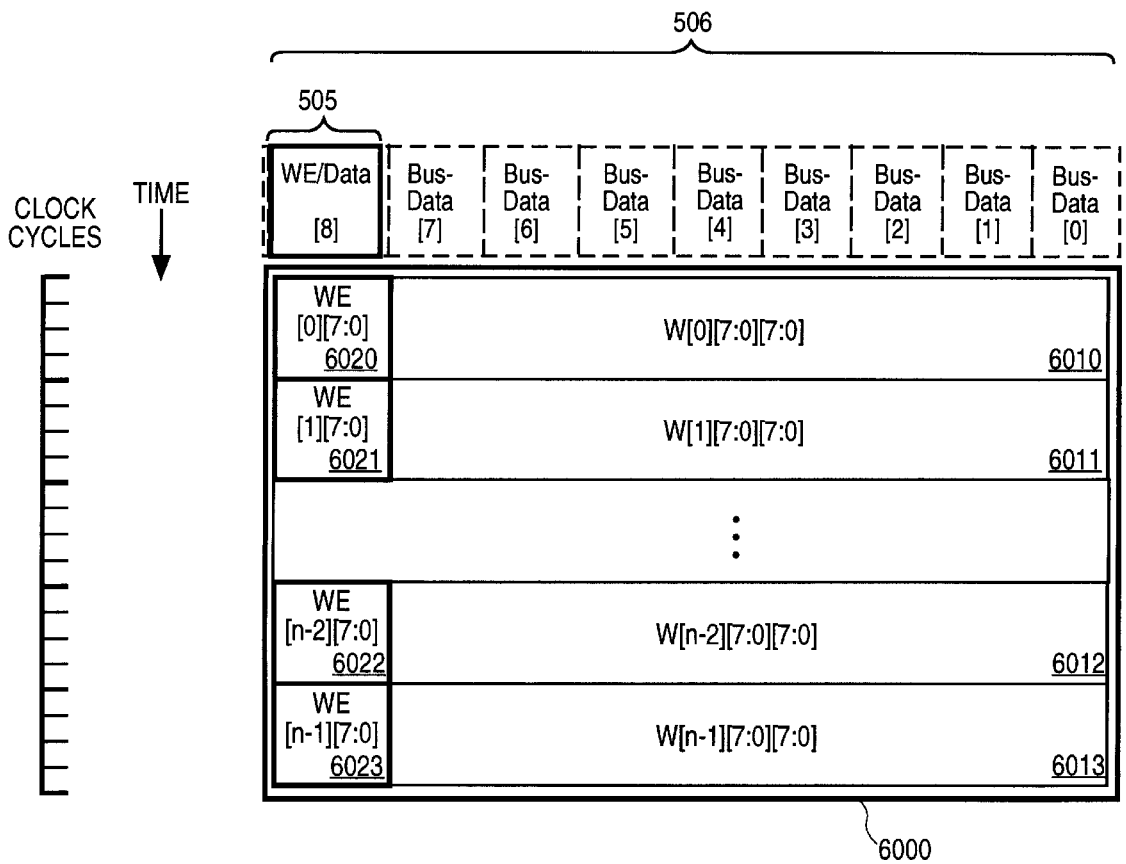
FIG. 16A illustrates a write transaction in which WE bits arrive with their respective data words or bytes.

In FIG. 16A, an embodiment is shown that allows multiplexing of data and WE information, but does not provide WE signals in advance of the data to which they refer. Block 6000 is comprised of write subblocks 6010 through 6013 and WE subblocks 6020 through 6023. Write subblocks 6010 through 6013 are each comprised of eight data words of eight bits each. WE subblocks 6020 through 6023 are each comprised of eight words, each having one WE bit. Write subblocks 6010 through 6013 are transferred on pins BusData[0] through BusData[7] of pins 506. WE subblocks 6020 through 6023 are transferred on pin 505, which is pin BusData[8]. Each WE bit of WE subblock 6020 refers to a respective data word of write subblock 6010. The respective data word of write subblock 6010 is transferred during the same half clock cycle as the respective WE bit of WE subblock 6020. Similarly, serial WE bits of WE subblocks 6021 through 6023 are transferred during the same half clock cycles as respective data words of write subblocks 6011 through 6013.

Figure 16B:
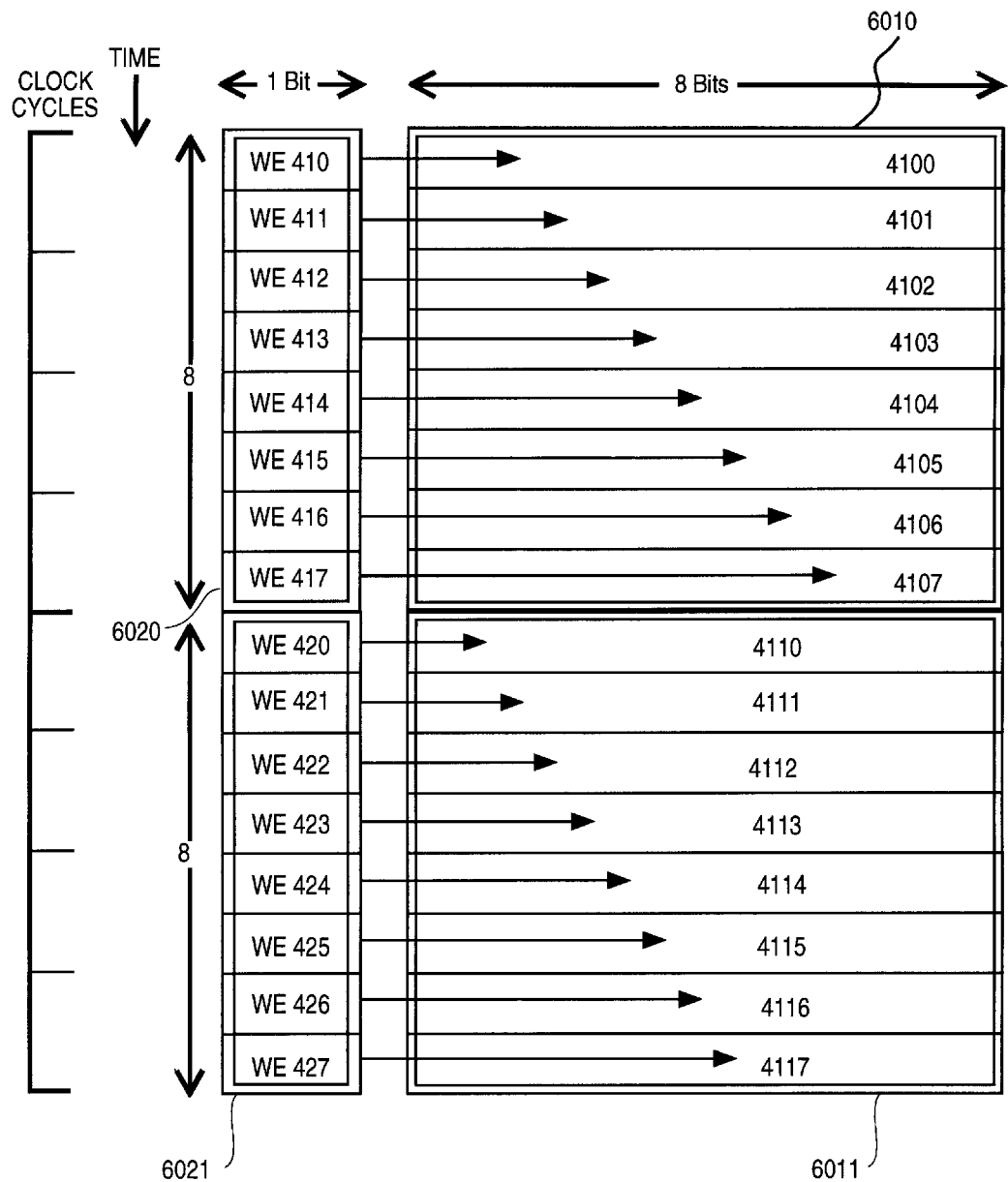
FIG. 16B illustrates the relationship between WE bits and data words when WE bits arrive with their respective data words.

FIG. 16B shows the relationship between WE bits and data bytes of write subblocks. For example, WE bit 410 indicates whether or not data byte 4100 will be written. Similarly, WE bit 411 indicates whether or not data byte 4101 will be written.

For the embodiment shown in FIGS. 16A and 16B, at different points in time pin 505 can be used for data and for EDC information, rather than just WE information. In other words, pin 505 allows the multiplexing of data and WE information.

The various embodiments described with respect to FIGS. 12A, 12B, 13A, 13B, 14, 15, 16A, and 16B may each be used during different operations of the same DRAM or DRAMs. The DRAM is directed by a DRAM master to operate in accordance with a particular embodiment. Specifically, the master directs the DRAM to treat the "s-1th" bit, or ninth bit, as a data bit or a WE bit. EDC is a type of data. This master direction can then be viewed as enabling or disabling WE, and can be accomplished in various ways.

One method for enabling or disabling the write enable function uses bits of the request packet to encode information directing the DRAM to treat the ninth bit as a data bit or a WE bit. Control logic circuitry 480 within DRAM 610 decodes that information and treats the ninth bit as data or a WE bit, depending on what the information says.

Figures 17, 18:
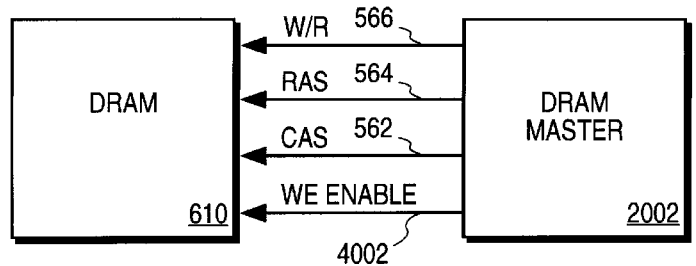
FIG. 17 illustrates a configuration with a WE enable signal.
FIG. 18 illustrates various DRAM functions encoded by control signals of a control interface.

Another method for enabling or disabling WE is shown in FIG. 17. In addition to sending DRAM 610 a W/R signal 566, a RAS signal 564, and a CAS signal 562, the DRAM master 2002 also sends to DRAM 610 a separate WE enable signal 4002 that enables or disables a WE function within DRAM 610 such that DRAM 610 will only treat the ninth bit as a WE bit when WE enable signal 4002 is active. The control logic circuitry 480 of DRAM 610 receives the WE enable signal 4002 and only treats the ninth bit as a WE bit when the WE enable signal is active.

Another method for enabling or disabling WE uses the three control signals CAS 562, RAS 564, and W/R 566 received by DRAM 610. As shown in FIG. 18, these three signals can encode eight operating modes. FIG. 18 shows some possible DRAM functions and the control signal states that indicate these functions. The control logic circuitry 480 of DRAM 610 decodes these signals and implements the functions or operating modes.

RAS operations are row sensing operations in which a row of memory cells is read into sense amplifiers in a DRAM. CAS operations are column access operations involving a read from a column location or a write to a column location. During a CAS cycle, an indeterminate number of column accesses may be made from the row currently in the sense amplifiers. A PRECHARGE operation initializes sense amplifiers before sensing.

In FIG. 18, a CAS READ is a column read. A CAS WRITE 1 is a write to a column with WE enabled. A CAS WRITE 2 is a column write with WE disabled. A CAS READ AUTO PRECHARGE is a column read with automatic precharge of sense amplifiers after the read so that a RAS may be started immediately after the column read. A CAS WRITE 1 AUTO PRECHARGE is a column write with WE enabled and with automatic precharge. A CAS WRITE 2 AUTO PRECHARGE is a column write with WE disabled and with automatic precharge. A PRECHARGE is the operation of initializing the sense amplifiers. A RAS is a row access operation.

The methods described above for enabling or disabling WE are dynamic methods in that they involve the sending and receipt of a signal or signals whenever a write operation is to take place. It is also possible to use a static signal stored in a register of DRAM 610. The register only changes state when the register is set or cleared by a control bit. The control logic circuitry 480 of DRAM 610 provides the control for this scheme.

Yet another method for enabling or disabling WE uses address space within the DRAM that is set aside as control space. The control space contains information that can include control information from outside the DRAM that is written into the control space using the addresses of the setaside memory space. The control logic circuitry 480 of DRAM 610 reads this control space and accordingly disables or enables the write enable function of the WE/data pin.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for writing to a memory, comprising:
   receiving data words;
   receiving write enable bits associated with the data words through a multiplexed write enable pin;
   sending or receiving additional data through the multiplexed write enable pin without blocking the receipt of the data words by the memory; and
   writing data words to the memory, the writing enabled by the write enable signals received in a previous clock cycle phase.

2. The method of claim 1, further comprising the step of initially providing the memory with write enable signals in parallel, wherein the parallel write enable signals are for data subsequently received.

3. The method of claim 2, wherein the parallel write enable signals are part of a request packet.

4. The method of claim 1, wherein the memory is a dynamic random access memory (DRAM).

5. The method of claim 1, wherein there is a time gap between the time the memory is provided with the serial sequence of write enable signals and the time the memory is provided with data, wherein memory operations can occur during that time gap, wherein the serial sequence of write enable signals are not applicable to the time gap memory operations.

6. A memory, comprising:
   an array for data storage;
   a plurality of data input contact electrodes that receive data words, and
   a multiplexed write enable pin that receives write enable bits associated with the data words and that can also send and receive additional data, without blocking the receipt of the data words by the data input contact electrodes the write enable bits enabling the writing of data received by the memory in a subsequent clock cycle phase.

7. The memory of claim 6, wherein the additional data stream that the separate contact electrode can receive comprises error detection and correction (EDC) information.

8. The memory of claim 6, wherein the memory is dynamic random access memory (DRAM).

9. The memory of claim 6, wherein an external memory controller provides the memory with information as to whether the separate contact electrode of the memory is receiving a write enable signal or receiving data.

10. The memory of claim 6, wherein each write enable signal of the serial sequence of write enable signals provides write enable information for respective data received by the data input contact electrodes at a next point in time.

11. A memory, comprising:
   an array for data storage;
   a plurality of data input contact electrodes that receive data words; and
   a multiplexed write enable pin that receives write enable signals associated with the data words and that can also send and receive additional data, without blocking the receipt of the data words by the contact electrodes wherein each write enable signal provides write enable information for respective data word received by the plurality of data input contact electrodes concurrently with the write enable information received by the multiplexed write enable pin.

12. The memory of claim 6, wherein the plurality of data input contact electrodes can also receive write enable information.

13. The memory of claim 12, wherein each bit of the write enable information that the plurality of data input contact electrodes can receive applies to a respective subsequent unit of data received in parallel by the plurality of data input contact electrodes.

14. The memory of claim 6, wherein the separate contact electrode for receiving the additional data stream can also send data stored in the memory.

15. A method for receiving data and write enable bits in a memory, comprising the steps of:
   receiving data words in parallel on a plurality of data contact electrodes;
   receiving write enable bits associated with the data words through a multiplexed write enable pin; and
   sending or receiving additional data through the multiplexed write enable pin without blocking the receipt of the data words by the memory;
   wherein the write enable bits enable the writing of the data words of a subsequent clock cycle phase.

16. The method of claim 15, further comprising the step of interpreting the additional data as error detection and correction (EDC) data.

17. The method of claim 15, further comprising the step of receiving information from an external memory controller as to whether the separate pin of the memory is receiving a write enable bit or a data bit.

18. The method of claim 18, wherein the data words are received offset in time with respect to the applicable serial sequence of write enable bits.

19. The method of claim 15, wherein the data words are received concurrently with the applicable serial sequence of write enable bits.

20. The method of claim 15, further comprising the step of writing or not writing data received on the plurality of data contact electrodes as indicated by the applicable serial sequence of write enable bits.

21. The method of claim 15, further comprising the step of receiving write enable information in parallel on the plurality of data contact electrodes.

22. The method of claim 21, further comprising the step of writing or not writing data received on the plurality of data contact electrodes at a next point in time as indicated by each bit of the write enable information received in parallel on the plurality of data contact electrodes.

23. The method of claim 22, wherein there is a time gap between the time the memory receives the write enable information in parallel on the plurality of data pins and the time the memory receives the data words, wherein memory operations can occur during that time gap, wherein the write enable information received in parallel on the plurality of data pins is not applicable to the time gap memory operations.

24. A memory, comprising:
an array for data storage;
a plurality of data input contact electrodes for receiving data words and parallel write enable information; and
a multiplexed write enable pin that receives write enable signals associated with the data words and that can also send and receive additional data, without blocking the receipt of the data words by the contact electrodes, the write enable signals enabling the writing of data received by the array in a subsequent clock cycle phase.

25. The memory of claim 24, wherein each write enable signal of the parallel write enable information and each write enable signal of the serial sequence of write enable signals provides write enable information for respective data received by the data input contact electrodes at a next point in time.

26. The memory of claim 24, wherein the memory is dynamic random access memory (DRAM).

27. The memory of claim 24, wherein the additional data that the separate contact electrode can receive comprises error detection and correction (EDC) information.

28. The memory of claim 27, wherein the EDC information comprises parity information relating to the data with which the parity information is received in parallel.

29. The memory of claim 27, wherein the EDC information comprises error correction code (ECC) information and wherein a plurality of bits of ECC information encode an ECC word relating to respective data received by the data contact electrodes.

30. The memory of claim 24, wherein an external memory controller provides the memory with information as to whether the separate pin of the memory is receiving a write enable signal or receiving data.

31. The memory of claim 30, wherein the information as to whether the separate contact electrode of the memory is receiving a write enable signal or receiving data is received by a separate control contact electrode of the memory.

32. The memory of claim 30, wherein the information as to whether the separate contact electrode of the memory is receiving a write enable signal or receiving data is encoded by signals on a plurality of control contact electrodes of the memory.

33. The memory of claim 30, wherein the information as to whether the separate contact electrode of the memory is receiving a write enable signal or receiving data is stored in a separate control register of the memory.

34. A method for receiving data and write enable information by a memory, comprising the steps of:
receiving data words and write enable information in parallel on a plurality of data contact electrodes;
receiving write enable bits associated with the data words through a multiplexed write enable pin; and
sending or receiving additional data through the multiplexed write enable pin without blocking the receipt of the data words by the contact electrodes.

35. The method of claim 34, wherein the data words are received offset in time with respect to the applicable serial sequence of write enable bits.

36. The method of claim 34, further comprising the step of writing or not writing data received on the plurality of data contact electrodes at a next point in time as indicated by the serial sequence of write enable bits and as indicated by each bit of the write enable information received in parallel on the plurality of data pins.

37. The method of claim 34, further comprising the step of interpreting the additional data bit as an error detection and correction (EDC) bit.

38. The method of claim 34, further comprising the step of receiving information from an external memory controller as to whether the separate contact electrode of the memory is receiving a write enable bit or a data bit.

39. The method of claim 37, further comprising the step of interpreting the EDC bit as a parity bit related to the data word with which it is received in parallel.

40. The method of claim 37, further comprising the steps of:
interpreting the EDC bit as an error correction code (ECC) bit; and
interpreting a plurality of ECC bits as an ECC word encoding ECC information related to a plurality of data words.

41. The method of claim 40, further comprising the step of receiving information from an external memory controller as to whether the separate contact electrode of the memory is receiving a write enable bit or a data bit.

42. The method of claim 41, further comprising the step of decoding the information received from the external memory controller as to whether the separate contact electrode of the memory is receiving a write enable bit or a data bit.

43. The method of claim 41, further comprising the step of storing the information received from the external memory controller as to whether the separate contact electrode of the memory is receiving a write enable bit or a data bit.

44. A computer system, comprising:
a central processing unit (CPU) for processing data;
a bus for transferring data between devices in the computer system; and
a memory subsystem for storing data as directed by the CPU, the memory subsystem comprising:
a dynamic random access memory (DRAM) controller for receiving directions from the CPU related to storing data and for conveying commands to a DRAM, the DRAM controller communicating with the CPU over the bus; and a DRAM comprising;

a memory array for data storage;

a plurality of data contact electrodes that receive data words; and a multiplexed write enable pin that receives write enable signals associated with the data words and that can also send and receive additional data, without blocking the receipt of the data words by the contact electrodes.

45. The computer system of claim 44, wherein the additional data that the separate contact electrode can receive comprises error detection and correction (EDC) information.

46. The computer system of claim 44, wherein the DRAM controller provides the DRAM with information as to whether the separate contact electrode of the DRAM is receiving a write enable signal or receiving data.

47. The computer system of claim 44, wherein each write enable signal of the serial sequence of write enable signals provides write enable information for respective data received by the data contact electrodes at a next point in time.

48. The computer system of claim 44, wherein each write enable signal of the serial sequence of write enable signals provides write enable information for respective data received by the plurality of data contact electrodes concurrently with the write enable information received by the separate contact electrode.

49. The computer system of claim 44, wherein the plurality of data contact electrodes can also receive write enable information.

50. The computer system of claim 49, wherein each bit of the write enable information that the plurality of data contact electrodes can receive applies to a respective subsequent unit of data received in parallel by the plurality of data input contact electrodes.

51. The computer system of claim 49, wherein the write enable information that the plurality of data contact electrodes can receive is part of information in a DRAM request packet.

52. A device having memory, the memory comprising:

an array for data storage;

a plurality of data input contact electrodes that receive data words; and a multiplexed write enable pin that receives write enable signals associated with the data words and that can also send and receive additional data, without blocking the receipt of the data words by the contact electrodes, the write enable signals enabling the writing of data received by the memory in a subsequent clock cycle phase.

* * * * *